US008889464B2

(12) United States Patent
Yi et al.

(10) Patent No.: US 8,889,464 B2
(45) Date of Patent: Nov. 18, 2014

(54) METHOD FOR MANUFACTURING SOLAR CELL

(71) Applicant: LG Electronics Inc., Seoul (KR)

(72) Inventors: Mann Yi, Seoul (KR); Jeonghyo Kwon, Seoul (KR); Seongeun Lee, Seoul (KR); Taeyoung Kwon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/890,931

(22) Filed: May 9, 2013

(65) Prior Publication Data
US 2014/0065757 A1 Mar. 6, 2014

(30) Foreign Application Priority Data

Aug. 28, 2012 (KR) ........................ 10-2012-0094199

(51) Int. Cl.
H01L 21/00 (2006.01)
H01L 31/0232 (2014.01)
H01L 31/0236 (2006.01)
H01L 21/02 (2006.01)
H01L 31/0216 (2014.01)
H01L 31/068 (2012.01)

(52) U.S. Cl.
CPC ...... H01L 31/0236 (2013.01); H01L 21/02054 (2013.01); H01L 31/02363 (2013.01); H01L 31/02168 (2013.01); Y02E 10/547 (2013.01); H01L 31/068 (2013.01); Y02E 10/52 (2013.01); H01L 31/02167 (2013.01)
USPC .................................. 438/71; 438/72; 257/436

(58) Field of Classification Search
USPC ........................................ 257/436; 438/71, 72
See application file for complete search history.

(56) References Cited

U.S. PATENT DOCUMENTS

| 2004/0152326 | A1  | 8/2004 | Inomata |
|---|---|---|---|
| 2007/0084505 | A1* | 4/2007 | Zaidi .............................. 136/256 |
| 2009/0142880 | A1* | 6/2009 | Weidman et al. ............... 438/98 |
| 2009/0173379 | A1* | 7/2009 | Kim .............................. 136/256 |
| 2010/0024871 | A1  | 2/2010 | Oh et al. |

(Continued)

FOREIGN PATENT DOCUMENTS

| EP | 1 005 095 A1 | 5/2000 |
|---|---|---|
| JP | 1-112746 A | 5/1989 |

(Continued)

OTHER PUBLICATIONS

Kern, "The Evolution of Silicon Wafer Cleaning Technology," J. Electrochem. Soc., vol. 137, No. 6, Jun. 1990, pp. 1887-1892, XP-002494756.

(Continued)

*Primary Examiner* — Karen Kusumakar
(74) *Attorney, Agent, or Firm* — Birch, Stewart, Kolasch & Birch, LLP

(57) ABSTRACT

A method for manufacturing a solar cell includes performing a dry etching process to form a textured surface including a plurality of minute protrusions on a first surface of a semiconductor substrate, performing a first cleansing process for removing damaged portions of surfaces of the minute protrusions using a basic chemical and removing impurities adsorbed on the surfaces of the minute protrusions, performing a second cleansing process for removing impurities remaining or again adsorbed on the surfaces of the minute protrusions using an acid chemical after performing the first cleansing process, and forming an emitter region at the first surface of the semiconductor substrate.

17 Claims, 13 Drawing Sheets

(56) References Cited

U.S. PATENT DOCUMENTS

| | | | |
|---|---|---|---|
| 2010/0051099 A1* | 3/2010 | Cheong et al. | 136/256 |
| 2011/0003466 A1* | 1/2011 | Scardera et al. | 438/565 |
| 2011/0230004 A1* | 9/2011 | Li et al. | 438/71 |
| 2012/0174960 A1 | 7/2012 | Hashigami et al. | |
| 2012/0220070 A1* | 8/2012 | Chiou et al. | 438/98 |

FOREIGN PATENT DOCUMENTS

| | | |
|---|---|---|
| JP | 8-306650 A | 11/1996 |
| JP | 2002-76404 A | 3/2002 |
| JP | 2008-192764 A | 8/2008 |
| WO | WO 2011/033826 A1 | 3/2011 |

OTHER PUBLICATIONS

Ouimet et al., "Defect Reduction and Cost Savings Through Re-Inventing RCA Cleans," IEEE/SEMI Advanced Semiconductor Manufacturing Conference, Nov. 12, 1996, pp. 308-313, XP-010204547.

Wong et al., "X-ray photoelectron spectroscopy on surface oxidation of silicon by some cleaning procedures," Applied Physics Letters, vol. 48, No. 18, May 5, 1986, (Abstract only), XP-055091650.

Zaidi et al., "Characterization of Random Reactive Ion Etched-Textured Silicon Solar Cells," IEEE Transactions on Electron Devices, vol. 48, No. 6, Jun. 1, 2001, pp. 1200-1206, XP-001082180.

\* cited by examiner

METHOD FOR MANUFACTURING SOLAR CELL

This application claims priority to and the benefit of Korean Patent Application No. 10-2012-0094199 filed in the Korean Intellectual Property Office on Aug. 28, 2012, the entire contents of which are incorporated herein by reference.

BACKGROUND OF THE INVENTION

1. Field of the Invention

Embodiments of the invention relate to a method for manufacturing a solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

When light is incident on the solar cell, electrons and holes are produced in the semiconductor parts. The electrons move to the n-type semiconductor part, and the holes move to the p-type semiconductor part under the influence of the p-n junction of the semiconductor parts.

Then, the electrons and the holes are collected by the different electrodes respectively connected to the n-type semiconductor part and the p-type semiconductor part.

SUMMARY OF THE INVENTION

In one aspect, there is a method for manufacturing a solar cell including performing a dry etching process to form a textured surface including a plurality of minute protrusions on a first surface of a semiconductor substrate, performing a first cleansing process for removing damaged portions of surfaces of the minute protrusions using a basic chemical and removing impurities adsorbed on the surfaces of the minute protrusions, performing a second cleansing process for removing impurities remaining or again adsorbed on the surfaces of the minute protrusions using an acid chemical after performing the first cleansing process, and forming an emitter region at the first surface of the semiconductor substrate.

The dry etching process includes a reaction ion etching method.

The basic chemical may be formed by mixing ultrapure water and a basic material having a hydroxyl radical (OH). Further, the basic chemical may additionally contain hydrogen peroxide. The acid chemical may be formed by mixing ultrapure water, hydrogen chloride, and hydrogen peroxide. Alternatively, the acid chemical may be formed by mixing ultrapure water, hydrogen chloride, and hydrogen fluoride. The method may further include again cleansing the surfaces of the minute protrusions using a diluted acid chemical between the first cleansing process and the second cleansing process and/or after the second cleansing process. The diluted acid chemical may be formed by mixing ultrapure water and hydrogen fluoride.

The forming of the emitter region includes injecting impurities of a first conductive type into the first surface of the semiconductor substrate using an ion implantation method or a thermal diffusion method.

The method may further include forming a second textured surface including a plurality of minute protrusions on a second surface opposite the first surface of the semiconductor substrate, and locally forming a back surface field region at the second surface of the semiconductor substrate.

The forming of the back surface field region includes injecting impurities of a second conductive type opposite the first conductive type into the second surface of the semiconductor substrate using the ion implantation method or the thermal diffusion method.

The method may further include forming a first dielectric layer on the second surface of the semiconductor substrate, simultaneously forming a second dielectric layer on the emitter region and on the first dielectric layer positioned on the second surface of the semiconductor substrate, forming a third dielectric layer on the second dielectric layer positioned on the emitter region, and forming a first electrode part connected to the emitter region and a second electrode part connected to the back surface field region.

The first dielectric layer and the third dielectric layer may be formed by depositing hydrogenated silicon nitride at a thickness of about 70 nm to 100 nm. The second dielectric layer may be formed by depositing aluminum oxide at a thickness of about 5 nm to 15 nm, and aluminum oxide may be deposited using an atomic layer deposition method.

The back surface field region may be formed in the same pattern as a plurality of finger electrodes of the second electrode part.

According to the above-described characteristics, embodiments of the invention perform the first cleansing process for removing the damaged portions of the surfaces of the minute protrusions using the basic chemical and at the same time removing impurities adsorbed on the surfaces of the minute protrusions, and perform the second cleansing process for removing impurities again adsorbed on the surfaces of the minute protrusions using the acid chemical. Then, the embodiments of the invention form the emitter region at the first surface of the semiconductor substrate.

Accordingly, the impurities adsorbed on the surfaces of the minute protrusions in a bath may be efficiently removed.

When the surfaces of the minute protrusions are again cleansed using the diluted acid chemical after the second cleansing process, an oxide layer on the surfaces of the minute protrusions after the second cleansing process may be removed, and impurities remaining in the surfaces of the minute protrusions may be again removed. Therefore, the cleansing operation may be more efficiently performed.

Because the emitter region is formed after performing the first and second cleansing processes, the emitter region may be stably formed.

Accordingly, current characteristics of the solar cell may be improved, and the damaged portions of the surfaces of the minute protrusions and the impurities adsorbed on the surfaces of the minute protrusions may be efficiently removed. Hence, efficiency of the solar cell may be improved.

Furthermore, because an anti-reflection layer and a passivation layer, each of which has a multi-layered structure, are respectively formed on the first and second surfaces of the semiconductor substrate, a reflection amount of light is reduced, and a surface passivation effect is obtained at the surface of the semiconductor substrate. Hence, the efficiency of the solar cell may be further improved.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
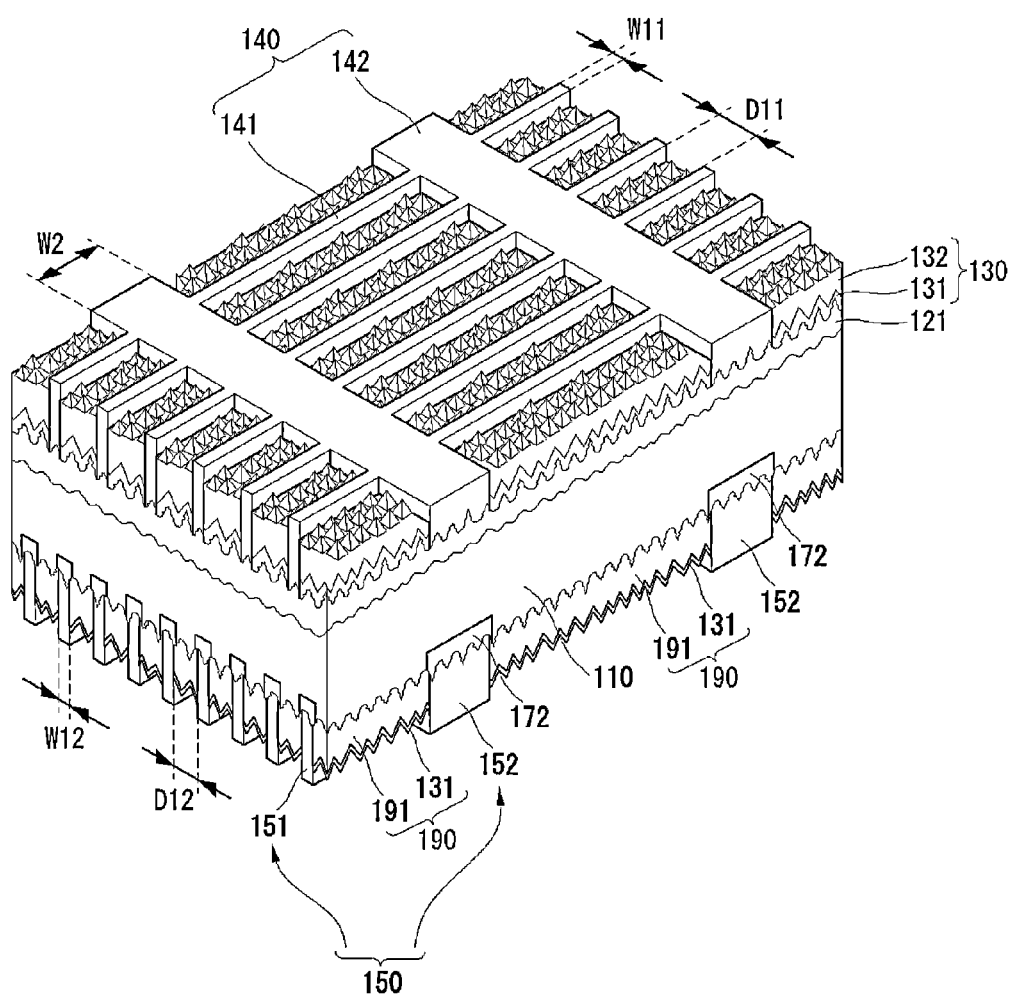
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein.

Wherever possible, the same reference numbers will be used throughout the drawings to refer to the same or like parts. It will be paid attention that detailed description of known arts will be omitted if it is determined that the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

In contrast, when an element is referred to as being "directly on" another element, there are no intervening elements present.

Further, it will be understood that when an element such as a layer, film, region, or substrate is referred to as being "entirely" on other element, it may be on the entire surface of the other element and may not be on a portion of an edge of the other element.

Example embodiments of the invention will be described with reference to FIGS. 1 to 8B.

A solar cell according to an example embodiment of the invention is described in detail with reference to FIG. 1.

As shown in FIG. 1, a solar cell according to an example embodiment of the invention includes a substrate 110, an emitter region 121 positioned at a front surface (or a first surface) of the substrate 110, a first dielectric layer part 130 positioned on the emitter region 121, a second dielectric layer part 190 positioned on a back surface (or a second surface) opposite the front surface of the substrate 110, a front electrode part (or a first electrode part) 140 which is positioned on the front surface of the substrate 110, is connected to the emitter region 121, and includes a plurality of front electrodes (or a plurality of first finger electrodes) 141 and a plurality of front bus bars (or a plurality of first bus bars) 142, a back electrode part (or a second electrode part) 150 which is positioned on the back surface of the substrate 110 and includes a plurality of back electrodes (or a plurality of second finger electrodes) 151 and a plurality of back bus bars (or a plurality of second bus bars) 152, and a plurality of back surface field regions 172 which are positioned under the plurality of back electrodes 151 and the plurality of back bus bars 152 at the back surface of the substrate 110.

In the embodiment of the invention, light is incident on at least one of the front surface and the back surface of the substrate 110.

The substrate 110 is a semiconductor substrate formed of a semiconductor such as first conductive type silicon, for example, n-type silicon, though not required. The semiconductor used in the substrate 110 is a crystalline semiconductor formed of single crystal silicon. The n-type substrate 110 is doped with impurities of a group V element such as phosphorus (P), arsenic (As), and antimony (Sb).

A texturing process is performed on the front surface of the substrate 110 to form a first textured surface corresponding to an uneven surface having a plurality of first protrusions 11 or having uneven characteristics. In this instance, the emitter region 121 and the first dielectric layer part 130 positioned on the front surface of the substrate 110 each have an uneven surface.

Each of the first protrusions 11 has a pyramid shape.

In the embodiment disclosed herein, the size, i.e., a maximum width 'a' and a maximum height 'b' of each of the first protrusions 11 may be about 5 μm to 15 μm. An aspect ratio 'b/a.' of each first protrusion 11 may be about 1.0 to 1.5.

Because the plurality of first protrusions 11 are positioned on the front surface of the substrate 110, an incident area of the substrate 110 increases and a light reflectance decreases due to a plurality of reflection operations resulting from each first protrusion 11. Hence, an amount of light incident on the substrate 110 increases, and the efficiency of the solar cell is improved.

As shown in FIG. 1, the plurality of first protrusions 11 may be formed on the back surface of the substrate 110. Alternatively, the first protrusions 11 may not be formed on the back surface of the substrate 110.

The maximum width 'a' of the first protrusion 11 may be determined within the range of about 5 μm to 15 μm. The size of the first protrusion 11 increases as the maximum width 'a' increases based on properties of crystalline silicon forming the substrate 110, and vice versa.

Accordingly, when the size of the first protrusion 11 is optimized so that the maximum width 'a' of the first protrusion 11 is about 5 μm to 15 μm and the aspect ratio 'b/a' of the first protrusion 11 is about 1.0 to 1.5, an optimum light path of incident light may be obtained.

Figure 2:
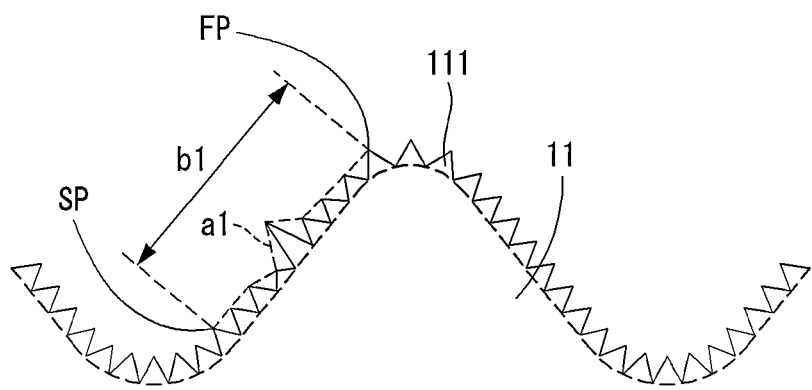
FIG. 2 is an enlarged view of a main part of FIG. 1.

As shown in FIG. 2, a plurality of minute protrusions 111 (hereinafter referred to as 'second protrusions') are positioned on the surface of each first protrusion 11, and thus a second textured surface is formed on the surface of each first protrusion 11.

The size (i.e., a maximum width and a maximum height) of each of the second protrusions 111 formed on the surface of each first protrusion 11 is less than the size of the first protrusion 11.

For example, the size, i.e., the maximum width and the maximum height of the second protrusion 111 may be several hundreds of nanometers, for example, about 300 nm to 600 nm.

When the second protrusions 111 are formed on the surface of the first protrusion 11, the incident area of the substrate 110 further increases. Further, because the reflection operation of light is repeatedly performed due to the second protrusions 111, an amount of light incident on the substrate 110 further increases.

As described above, the surface of the substrate 110 is formed as the first textured surface having the plurality of first protrusions 11, and the surface of each first protrusion 11 is formed as the second textured surface having the plurality of second protrusions 111. Thus, the surface of the substrate 110 has the double textured surface. Hence, light having a wavelength of about 300 nm to 1,100 nm has a low reflectance (for example, average weighted reflectance) of about 1% to 10%.

The second protrusions 111 are described in detail below.

As described above, the plurality of second protrusions 111 are formed on the surface of each first protrusion 11, and each second protrusion 111 has a maximum width and a maximum height of about 300 nm to 600 nm.

In the embodiment disclosed herein, the maximum width of the second protrusion 111 is a distance between valleys of the second protrusion 111 in the same manner as the maximum width of the first protrusion 11. Further, the maximum height of the second protrusion 111 is a shortest distance ranging from a virtual line connecting the valleys of the second protrusion 111 to a peak of the second protrusion 111 in the same manner as the maximum height of the first protrusion 11.

In a vertical cross section of the second protrusions 111, a ratio a1/b1 of a length a1 of a virtual line connecting vertexes of the second protrusions 111 to a length b1 of a straight line connecting a start point SP and a finish point FP of the virtual line is about 1.1 to 1.3.

FIG. 2 illustrates the measurement of the ratio a1/b1 of the nine second protrusions 111. However, the ratio a1/b1 may be measured using the three or more second protrusions 111. It is preferable, but not required, that at least five second protrusions 111 are used so as to secure the reliability of the measurement.

According to an experiment of the present inventors, when the ratio a1/b1 was greater than about 1.3, the size, i.e., the maximum width and the maximum height of each second protrusion 111 were about 500 nm to 1,000 nm. Namely, the sizes of the second protrusions 111 were non-uniform and thus entirely had low uniformity.

Further, when the ratio a1/b1 was less than about 1.1, the size of each second protrusion 111 was equal to or less than about 200 nm. Namely, the sizes of the second protrusions 111 were uniform and thus entirely had good uniformity.

The uniformity of the second protrusions 111 when the ratio a1/b1 was less than about 1.1 was more excellent than the uniformity of the second protrusions 111 when the ratio a1/b1 was greater than about 1.3.

On the other hand, a reflectance of light when the ratio a1/b1 was greater than about 1.3 was equal to or less than about 7%, and a reflectance of light when the ratio a1/b1 was less than about 1.1 was equal to or greater than about 10%.

As described above, the reflectance of the second textured surface increases and decreases in inverse proportion to the ratio a1/b1. This reason is that the sizes of the second protrusions 111 decrease as the ratio a1/b1 becomes close to 1, and thus the reflectance of the second textured surface increases.

As described above, when the ratio a1/b1 is greater than about 1.3, the reflectance is low. Thus, a conversion efficiency of the solar cell can be improved. However, the sizes of the second protrusions 111 having the ratio a1/b1 greater than about 1.3 are non-uniform and entirely have the low uniformity, as compared with the second protrusions 111 having the ratio a1/b1 less than about 1.1. Therefore, when the ratio a1/b1 is greater than about 1.3, a recombination rate of electrons and holes increases.

In addition, a current path increases, and a dead area increases. Thus, a loss of current greatly increases because of the above reasons. Therefore, it is preferable, but not required, that the second textured surface is formed so that the ratio a1/b1 is set to be equal to or less than about 1.3, so as to improve the conversion efficiency of the solar cell.

Further, the second textured surface having the ratio a1/b1 less than about 1.1 may suppress the problem generated in the second textured surface having the ratio a1/b1 greater than about 1.3. However, because the reflectance of the second textured surface having the ratio a1/b1 less than about 1.1 greatly increases, a short circuit current density increases as compared with the second textured surface having the ratio a1/b1 greater than about 1.3. Hence, the conversion efficiency of the solar cell is reduced.

Accordingly, it is preferable, but not required, that the second textured surface is formed so that the ratio a1/b1 is set to be equal to or greater than about 1.1, so as to improve the conversion efficiency of the solar cell.

According to the above description, it may be preferable, but not required, that the second protrusions 111 of the second textured surface have the ratio a1/b1 of about 1.1 to 1.3 and each have the size of about 300 nm to 600 nm.

As described above, when the ratio a1/b1 of the second protrusions 111 of the second textured surface is about 1.1 to 1.3, a ratio of a surface area to a real area of the second textured surface in a unit area, for example, the area of 10 μm×10 μm of the second textured surface is about 2 to 2.5. The size of the unit area may be changed.

Figure 3:
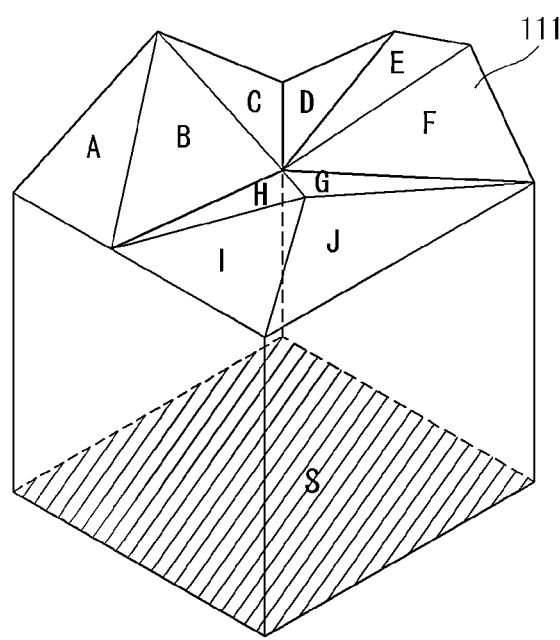
FIG. 3 is a conceptual diagram illustrating a ratio of a surface area to a real area of a second textured surface.

In the embodiment disclosed herein, the surface area is a sum (for example, a sum of surface areas of triangles A, B, C, D, E, F, G, H, I, and J shown in FIG. 3) of surface areas of the second protrusions 111 formed on the second textured surface of the unit area. The real area is a projection area (indicated by 'S' of FIG. 3) viewed from a vertical direction of the surface of the substrate 110.

The emitter region 121 positioned at the front surface of the substrate 110 is an impurity region doped with impurities of a second conductive type (for example, p-type) opposite the first conductive type (for example, n-type) of the substrate 110. Thus, the emitter region 121 of the second conductive type forms a p-n junction along with the substrate 110 of the first conductive type.

In the embodiment of the invention, a sheet resistance of the emitter region 121 may be equal to or less than about 150 Ω/sq., preferably, about 70 Ω/sq. to 80 Ω/sq.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the n-type and the emitter region 121 is of the p-type, the electrons and the holes move to the substrate 110 and the emitter region 121, respectively.

When the emitter region 121 is of the p-type, the emitter region 121 may be formed by doping the substrate 110 with impurities of a group III element such as boron (B), gallium (Ga), and indium (In). In this instance, the emitter region 121 may be formed using an ion implantation method, among other methods.

The first dielectric layer part 130 includes a second dielectric layer 131 positioned on the emitter region 121 and a third dielectric layer 132 positioned on the second dielectric layer 131.

In the embodiment of the invention, the second dielectric layer 131 may be formed of aluminum oxide ($Al_2O_3$), and the third dielectric layer 132 may be formed of hydrogenated silicon nitride (SiNx:H).

The second dielectric layer 131 formed of aluminum oxide ($Al_2O_3$) may have a thickness of about 5 nm to 15 nm and a refractive index of about 1.1 to 1.6. The third dielectric layer 132 formed of hydrogenated silicon nitride (SiNx:H) may have a thickness of about 70 nm to 100 nm and a refractive index of about 2.0 to 2.2.

In this instance, because the refractive index of the second dielectric layer 131 adjacent to the substrate 110 is less than the refractive index of the third dielectric layer 132 adjacent to an air, an anti-reflection effect is reduced due to the refractive index of the second dielectric layer 131. It is preferable, but not required, that the thickness of the second dielectric layer 131 is much less than the thickness of the third dielectric layer 132, so as to prevent a reduction in the anti-reflection effect.

The second dielectric layer 131 formed of aluminum oxide ($Al_2O_3$) is positioned on the front surface of the substrate 110, i.e., directly on the emitter region 121 positioned at the front surface of the substrate 110.

In general, aluminum oxide ($Al_2O_3$) has negative fixed charges.

Thus, positive fixed charges (i.e., holes) are drawn to the p-type emitter region 121 and electrons are pushed to the back surface of the substrate 110 by the second dielectric layer 131 formed of aluminum oxide ($Al_2O_3$), which is positioned on the p-type emitter region 121 and has negative fixed charges. Namely, a field passivation effect is obtained.

Accordingly, an amount of holes moving to the emitter region 121 further increases by the second dielectric layer 131 formed of aluminum oxide ($Al_2O_3$), and an amount of electrons moving to the emitter region 121 decreases by the second dielectric layer 131. Hence, a recombination of electrons and holes at and around the emitter region 121 is reduced.

Oxygen (O) contained in aluminum oxide ($Al_2O_3$) for forming the second dielectric layer 131 moves to the surface of the substrate 110 abutting on the second dielectric layer 131, thereby performing a passivation function for converting a defect, for example, dangling bonds existing at and around the surface of the substrate 110 into stable bonds.

It is preferable, but not required, that the second dielectric layer 131 formed of aluminum oxide ($Al_2O_3$) is formed using an atomic layer deposition (ALD) method having a good step coverage.

As described above, the second textured surface as well as the first textured surface are formed on the front surface of the substrate 110. Therefore, a roughness of the front surface (i.e., the surface of the emitter region 121) of the substrate 110 abutting on the second dielectric layer 131 of the first dielectric layer part 130 is greater than a roughness of the substrate having only the first textured surface.

If the second dielectric layer 131 is formed directly on the emitter region 121 using a deposition method such as a plasma enhanced chemical vapor deposition (PECVD) method, the second dielectric layer 131 may not be normally coated on the first and second protrusions 11 and 111. Hence, a non-formation area of the second dielectric layer 131 may increase in the first and second textured surfaces of the substrate 110.

In this instance, a surface passivation effect may not be generated in the non-formation area of the second dielectric layer 131. As a result, an amount of carriers lost at and around the surface of the substrate 110 may increase.

On the other hand, when the second dielectric layer 131 is formed directly on the emitter region 121 using the atomic layer deposition method having the good step coverage as in the embodiment of the invention, the second dielectric layer 131 is normally formed on the first and second protrusions 11 and 111. Hence, the non-formation area of the second dielectric layer 131 decreases in the first and second textured surfaces of the substrate 110.

Accordingly, because a formation area of the second dielectric layer 131 increases in the first and second textured surfaces of the substrate 110, the surface passivation effect using the second dielectric layer 131 is improved. Hence, an amount of carriers lost at and around the surface of the substrate 110 decreases, and the efficiency of the solar cell is improved.

The third dielectric layer 132 formed of hydrogenated silicon nitride (SiNx:H) is formed directly on the second dielectric layer 131 positioned on the front surface of the substrate 110.

Hydrogen (H) contained in hydrogenated silicon nitride (SiNx:H) for forming the third dielectric layer 132 moves to the surface of the substrate 110 via the second dielectric layer 131, thereby performing a passivation function at and around the surface of the substrate 110.

Accordingly, an amount of carriers lost by the defect at and around the surface of the substrate 110 further decreases by the passivation function resulting from the third dielectric layer 132 as well as the second dielectric layer 131.

As described above, the first dielectric layer part 130 positioned on the front surface of the substrate 110 has a double layered anti-reflection structure including the second dielectric layer 131 formed of aluminum oxide ($Al_2O_3$) and the third dielectric layer 132 formed of hydrogenated silicon nitride (SiNx:H).

Accordingly, the field passivation effect resulting from the fixed charges of the second dielectric layer 131 and the surface passivation effect resulting from the second and third dielectric layers 131 and 132 are additionally obtained in addition to the anti-reflection effect of light using changes in the refractive indexes of the second and third dielectric layers 131 and 132.

When the thickness of the second dielectric layer 131 formed of aluminum oxide is equal to or greater than about 5 nm, the aluminum oxide layer 131 is more uniformly formed and the field passivation effect resulting from the fixed charges of the second dielectric layer 131 is more stably obtained through the stable generation of the fixed charges of the second dielectric layer 131. When the thickness of the second dielectric layer 131 is equal to or less than about 15 nm, manufacturing time and cost of the second dielectric layer 131 are reduced without a reduction in the anti-reflection effect resulting from the refractive indexes of the second and third dielectric layers 131 and 132.

When the thickness of the third dielectric layer 132 formed of hydrogenated silicon nitride is equal to or greater than about 70 nm, the silicon nitride layer 132 is more uniformly formed and the surface passivation effect using hydrogen (H) is more stably obtained. When the thickness of the third dielectric layer 132 is equal to or less than about 100 nm, the field passivation effect resulting from hydrogenated silicon nitride having positive fixed charges is not reduced. Further, manufacturing time and cost of the third dielectric layer 132 are reduced.

Each of the back surface field regions 172 positioned at the back surface of the substrate 110 is a region that is more heavily doped than the substrate 110 with impurities of the same first conductive type (for example, the n-type) as the substrate 110.

The back surface field regions 172 abut on the back electrodes 151 and the back bus bars 152 positioned on the back surface of the substrate 110 and are locally positioned at the back surface of the substrate 110.

The fact that the back surface field region 172 is locally positioned at the back surface of the substrate 110 means that the back surface field region 172 is positioned only at the back surface of the substrate 110 at a position corresponding to at least one of the back electrode 151 and the back bus bar 152.

Hence, the back surface field region 172 is not positioned between the adjacent back electrodes 151, between the back electrode 151 and the back bus bar 152 which are positioned adjacent to each other, and between the adjacent back bus bars 152.

A potential barrier is formed by a difference between impurity concentrations of a first conductive type region (for example, an n-type region) of the substrate 110 and the back surface field regions 172. Hence, the potential barrier prevents or reduces holes from moving to the back surface field regions 172 used as a moving path of electrons and makes it easier for electrons to move to the back surface field regions 172.

Thus, the back surface field regions 172 reduce an amount of carriers lost by a recombination and/or a disappearance of the electrons and the holes at and around the back surface of the substrate 110 and accelerate a movement of desired carriers (for example, electrons), thereby increasing an amount of carriers moving to the back electrode part 150.

Because the impurity concentration of the back surface field regions 172 is higher than the impurity concentration of the substrate 110, the conductivity of the back surface field regions 172 abutting on the back electrode part 150 is greater than the conductivity of the substrate 110. Hence, a movement of carriers from the back surface field regions 172 to the back electrode part 150 is easily carried out.

The second dielectric layer part 190 includes a first dielectric layer 191 positioned directly on the back surface of the substrate 110 and a second dielectric layer 131 positioned directly on the first dielectric layer 191.

The first dielectric layer 191 may be formed of hydrogenated silicon nitride (SiNx:H), and the second dielectric layer 131 may be formed of aluminum oxide ($Al_2O_3$) as described above.

In this instance, the first dielectric layer 191 may be formed of the same material as the third dielectric layer 132 and thus may have the same characteristics, for example, thickness, properties, component, composition (or composition ratio), refractive index, etc. as the third dielectric layer 132.

More specifically, the first dielectric layer 191 formed of hydrogenated silicon nitride (SiNx:H) may have a thickness of about 70 nm to 100 nm and a refractive index of about 2.0 to 2.2 in the same manner as the third dielectric layer 132. The second dielectric layer 131 formed of aluminum oxide ($Al_2O_3$) may have a thickness of about 5 nm to 15 nm and a refractive index of about 1.1 to 1.6.

Because the first dielectric layer 191 formed of hydrogenated silicon nitride (SiNx:H) is positioned on the back surface field regions 172 positioned directly on the back surface of the substrate 110, the surface passivation function using hydrogen (H) is performed. Hence, an amount of carriers lost by the defect at and around the back surface of the substrate 110 decreases.

Hydrogenated silicon nitride (SiNx:H) has the characteristic of positive fixed charges opposite aluminum oxide ($Al_2O_3$).

In the embodiment disclosed herein, the substrate 110 is of the n-type, and the first dielectric layer 191 formed of hydrogenated silicon nitride (SiNx:H) is formed directly on the back surface of the substrate 110. Hence, because negative charges (i.e., electrons) moving to the first dielectric layer 191 have the polarity opposite the first dielectric layer 191 having the characteristic of positive charges, the negative charges (i.e., electrons) are drawn to the first dielectric layer 191 due to the positive polarity of the first dielectric layer 191.

Further, positive charges (i.e., holes) having the same polarity as the first dielectric layer 191 are pushed to the front surface of the substrate 110 opposite the first dielectric layer 191 because of the positive polarity of the first dielectric layer 191.

Hence, when hydrogenated silicon nitride (SiNx:H) is deposited directly on the back surface of the n-type substrate 110 to form the first dielectric layer 191, an amount of electrons moving to the back surface of the substrate 110 further increases because of the influence of positive fixed charges. Further, the recombination of the electrons and the holes at and around the back surface of the substrate 110 is reduced.

The second dielectric layer 131, which is formed on the first dielectric layer 191 using aluminum oxide ($Al_2O_3$), prevents hydrogen (H) contained in the first dielectric layer 191 from moving to the back electrode part 150 opposite the front surface of the substrate 110 because of heat applied when the solar cell is manufactured. As a result, the surface passivation effect of the back surface of the substrate 110 using hydrogen (H) contained in the first dielectric layer 191 is improved.

As described above, the second dielectric layer part 190 including the first dielectric layer 191 formed of hydrogenated silicon nitride (SiNx:H) and the second dielectric layer 131 formed of aluminum oxide ($Al_2O_3$) has a double layered anti-reflection structure at the back surface of the substrate 110, in the same manner as the double layered anti-reflection structure of the first dielectric layer part 130 positioned on the front surface of the substrate 110. Hence, the surface passivation effect of the back surface of the substrate 110 is improved.

It is preferable, but not required, that the thickness of the first dielectric layer 191 is greater than the thickness of the second dielectric layer 131 positioned on the first dielectric layer 191, so that the second dielectric layer 131 having the strong negative fixed charges does not adversely affect the first dielectric layer 191 having the positive fixed charges. Further, the thickness of the first dielectric layer 191 may be greater than the thickness of the third dielectric layer 132 on the front surface of the substrate 110.

Accordingly, if necessary, the thickness of the third dielectric layer 132 positioned on the front surface of the substrate 110 may be different from the thickness of the first dielectric layer 191 positioned on the back surface of the substrate 110. In this instance, the third dielectric layer 132 positioned on the front surface of the substrate 110 may have the thickness of about 90 nm, and the first dielectric layer 191 positioned on the back surface of the substrate 110 may have the thickness of about 100 nm.

When light is incident on the back surface of the substrate 110, a refractive index from an air to the substrate 110 increases. Therefore, a reflection amount of light incident on the back surface of the substrate 110 decreases, and an amount of light incident into the substrate 110 decreases. As described above, when light is incident on the back surface of the substrate 110, the second dielectric layer part 190 may serve as an anti-reflection layer.

The plurality of front electrodes 141 of the front electrode part 140 are connected to the emitter region 121, and the plurality of front bus bars 142 of the front electrode part 140 are connected to the front electrodes 141 as well as the emitter region 121.

The front electrodes 141 are electrically and physically connected to the emitter region 121 and are separated from one another. The front electrodes 141 extend parallel to one another in a fixed direction. The front electrodes 141 collect carriers (for example, holes) moving to the emitter region 121.

The front bus bars 142 are electrically and physically connected to the emitter region 121 and extend parallel to one another in a direction crossing the front electrodes 141.

The front bus bars 142 have to collect not only carriers (for example, holes) moving from the emitter region 121 but also carriers collected by the front electrodes 141 crossing the front bus bars 142 and have to move the collected carriers in a desired direction. Thus, a width of each front bus bar 142 is greater than a width of each front electrode 141.

In the embodiment of the invention, the front bus bars 142 are positioned on the same level layer as the front electrodes 141 and are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a longitudinal (or transverse) direction. Hence, the front electrode part 140 has a lattice shape on the front surface of the substrate 110.

The front bus bars 142 are connected to an external device and output the collected carriers to the external device.

The front electrode part 140 including the front electrodes 141 and the front bus bars 142 is formed of at least one conductive material, for example, silver (Ag).

The plurality of back electrodes 151 of the back electrode part 150 are positioned on the back surface field regions 172 and directly abut on the back surface field regions 172. The back electrodes 151 are separated from one another and extend in a fixed direction in the same manner as the front electrodes 141.

In this instance, the back electrodes 151 extend in the same direction as the front electrodes 141. The back electrodes 151 collect carriers (for example, electrons) moving to the back surface field regions 172.

The plurality of back bus bars 152 of the back electrode part 150 are positioned on the back surface field regions 172 and abut on the back surface field regions 172. The back bus bars 152 extend parallel to one another in a direction crossing the back electrodes 151.

In this instance, the back bus bars 152 extend in the same direction as the front bus bars 142. The back bus bars 152 may be positioned opposite the front bus bars 142 with the substrate 110 interposed between them.

The back bus bars 152 collect carriers (for example, electrons) collected by the back electrodes 151 crossing the back bus bars 152 and move the collected carriers in a desired direction. Thus, a width of each back bus bar 152 is greater than a width of each back electrode 151.

The back bus bars 152 are positioned on the same level layer as the back electrodes 151 and are electrically and physically connected to the back electrodes 151 at crossings of the back electrodes 151 and the back bus bars 152.

Thus, the back electrode part 150 has a lattice shape on the back surface of the substrate 110 in the same manner as the front electrode part 140.

The back electrodes 151 and the back bus bars 152 may contain the same conductive material, for example, silver (Ag) as the front electrodes 141 and the front bus bars 142. Alternatively, the back electrode part 150 may be formed of a material different from the front electrode part 140, and the back electrodes 151 may be formed of a material different from the back bus bars 152.

As described above, in the embodiment of the invention, the back surface field regions 172 are positioned under the back electrodes 151 and the back bus bars 152 and extend along the back electrodes 151 and the back bus bars 152.

Hence, the back surface field regions 172 are locally positioned at the back surface of the substrate 110 and have a lattice shape in the same manner as the back electrode part 150. Thus, as described above, a non-formation portion of the back surface field regions 172 exists at the back surface of the substrate 110.

In the embodiment of the invention, the number of front electrode 141 positioned on the front surface of the substrate 110, on which the most of light is incident, is less than the number of back electrode 151 positioned on the back surface of the substrate 110, on which a smaller amount of light than the front surface of the substrate 110 is incident. Thus, a distance between the two adjacent front electrodes 141 is greater than a distance between the two adjacent back electrodes 151.

As described above, because the front electrode part 140 and the back electrode part 150 contain a metal material such as silver (Ag), the front electrode part 140 and the back electrode part 150 do not transmit light.

Accordingly, because the distance between the front electrodes 141 positioned on the front surface of the substrate 110 is greater than the distance between the back electrodes 151, a reduction in an incident area of light at the front surface of the substrate 110 is prevented by the front electrodes 141. Hence, an amount of light incident on the front surface of the substrate 110 increases.

In another embodiment, the front bus bars 142, the back bus bars 152, or both may be omitted.

In the embodiment of the invention, at least one of the front electrode part 140 and the back electrode part 150 may be formed using a plating method.

When at least one of the front electrode part 140 and the back electrode part 150 is formed using the plating method, at least one of the front electrode part 140 and the back electrode part 150 may have a single-layered structure as in the embodiment of the invention. Alternatively, at least one of the front electrode part 140 and the back electrode part 150 may have a multi-layered structure such as a double-layered structure and a triple-layered structure. When at least one of the front electrode part 140 and the back electrode part 150 formed using the plating method has the single-layered structure, at least one of the front electrode part 140 and the back electrode part 150 may be formed of silver (Ag).

When at least one of the front electrode part 140 and the back electrode part 150 formed using the plating method has the double-layered structure, a lower layer (or a first layer), which abuts on the emitter region 121 (i.e., a second conductive type region of the substrate 110) or abuts on the back surface field regions 172 (i.e., a heavily doped region of the substrate 110 doped with impurities of the first conductive type), may be formed of nickel (Ni), and an upper layer (or a second layer) on the lower layer may be formed of silver (Ag).

When at least one of the front electrode part 140 and the back electrode part 150 formed using the plating method has the triple-layered structure, a lower layer (or a first layer) abutting on the emitter region 121 or the back surface field regions 172 may be formed of nickel (Ni), a middle layer (or a second layer) on the lower layer may be formed of copper (Cu), and an upper layer (or a third layer) on the middle layer may be formed of silver (Ag) or tin (Sn).

When at least one of the front electrode part 140 and the back electrode part 150 formed using the plating method has the double-layered structure, a thickness of the lower layer may be about 0.5 µm to 1 µm, and a thickness of the upper layer may be about 5 µm to 10 µm.

When at least one of the front electrode part 140 and the back electrode part 150 formed using the plating method has the triple-layered structure, each of the lower layer and the upper layer may have a thickness of about 0.5 µm to 1 µm, and a thickness of the middle layer may be about 5 µm to 10 µm.

In this instance, the lower layer is to reduce a contact resistance between the lower layer and the emitter region 121 abutting on the lower layer or between the lower layer and the back surface field regions 172 abutting on the lower layer, thereby improving contact characteristics. The middle layer may be formed of a cheap material with the good conductivity, for example, copper (Cu) in consideration of cost reduction.

If the middle layer is formed of copper (Cu), the lower layer underlying the middle layer may prevent copper (Cu), which is smoothly bonded to silicon (Si), from serving as an impurity region, which is penetrated (absorbed) in the emitter region 121 or the back surface field regions 172 formed of silicon (Si) to thereby prevent the movement of carriers.

The upper layer prevents the oxidation of the layer (for example, the lower layer or the middle layer) underlying the upper layer and improves an adhesive strength between the layer (for example, the lower layer or the middle layer) and a conductive film, for example, a ribbon positioned on the upper layer.

As described above, at least one of the front electrode part 140 and the back electrode part 150 formed using the plating method may have the double-layered structure or the triple-layered structure, and the lower layer may be formed of nickel (Ni). In this instance, nickel silicide compounds exist between the lower layer and the emitter region 121 or between the lower layer and the back surface field regions 172 because of a bond between nickel (Ni) and silicon (Si) of the emitter region 121 (i.e., the second conductive type region of the substrate 110) or a bond between nickel (Ni) and silicon (Si) of the back surface field regions 172 (i.e., the heavily doped region of the substrate 110 doped with impurities of the first conductive type).

Alternatively, at least one of the front electrode part 140 and the back electrode part 150 may be formed through a screen printing method using an Ag paste containing a glass frit or an Al paste containing the glass frit. In this instance, the glass frit may pass through the first dielectric layer part 130 or the second dielectric layer part 190 and may abut on the emitter region 121 or the back surface field regions 172.

Accordingly, at least one of components of the glass frit is detected in a contact portion between the front electrode part 140 and the emitter region 121 or a contact portion between the back electrode part 150 and the back surface field regions 172. For example, at least one of lead (Pb)-based material such as PbO, bismuth (Bi)-based material such as $Bi_2O_3$, aluminum (Al)-based material such as $Al_2O_3$, boron (B)-based material such as $B_2O_3$, tin (Sn)-based material, zinc (Zn)-based material such as ZnO, titanium (Ti)-based material such as TiO, and phosphorus (P)-based material such as $P_2O_5$ contained in the glass frit may be detected.

On the other hand, when at least one of the front electrode part 140 and the back electrode part 150 is formed using the plating method, the component of the glass frit is not detected between the substrate 110 (i.e., the emitter region 121) and the front electrode part 140 including the front electrodes 141 and the front bus bars 142 and between the substrate 110 (i.e., the back surface field regions 172) and the back electrode part 150 including the back electrodes 151 and the back bus bars 152.

As described above, when at least one of the front electrode part 140 and the back electrode part 150 has the multi-layered structure, the lower layer, the middle layer, and the upper layer are sequentially formed using the plating method to have a desired thickness.

In the embodiment of the invention, the number of front electrodes 141, the number of front bus bars 142, the number of back electrodes 151, and the number of back bus bars 152 may vary, if desired or necessary.

Each front bus bar 142 and each back bus bar 152 respectively collect carriers from the emitter region 121 and the back surface field regions 172 and also respectively output carriers collected by the front electrodes 141 and carriers collected by the back electrodes 151 to the external device.

In another embodiment, at least one of the front bus bar 142 and the back bus bar 152 may be positioned directly on at least one of the first dielectric layer part 130 and the second dielectric layer part 190 and may abut on at least one of the first dielectric layer part 130 and the second dielectric layer part 190.

As described above, because each of the front surface and the back surface of the substrate 110 has the first and second textured surfaces, a surface area of the substrate 110 increases.

Hence, an area of the emitter region 121 contacting each front electrode 141 and an area of the back surface field region 172 contacting each back electrode 151 increase. Therefore, even if a width W11 of each front electrode 141 and a width W12 of each back electrode 151 decrease, a contact area between the emitter region 121 and the front electrode 141 and a contact area between the back surface field region 172 and the back electrode 151 may not decrease.

As a result, even if the width W11 of each front electrode 141 and the width W12 of each back electrode 151 decrease, an amount of carriers moving from the emitter region 121 to the front electrodes 141 and an amount of carriers moving from the back surface field regions 172 to the back electrodes 151 may not decrease.

In the embodiment of the invention, the width W11 of each front electrode 141 and the width W12 of each back electrode 151 may be about 40 µm to 50 µm.

As described above, because formation areas of the front electrodes 141 and the back electrodes 151 to prevent or reduce the incidence of light at the front surface and the back surface of the substrate 110 are reduced, an amount of light incident on the front surface and the back surface of the substrate 110 increases.

However, a moving distance of carriers moving to the front electrodes 141 along the emitter region 121 and a moving distance of carriers moving to the back electrodes 151 along the back surface field regions 172 increase because of the first and second textured surfaces of the substrate 110.

Accordingly, in the embodiment of the invention, a distance D11 between the two adjacent front electrodes 141 and a distance D12 between the two adjacent back electrodes 151 may decrease, so as to compensate for an increase in the moving distance of carriers resulting from an increase in a surface area of the emitter region 121 and a surface area of the back surface field regions 172.

For example, the distance D11 between the two adjacent front electrodes 141 and the distance D12 between the two adjacent back electrodes 151 may be equal to or greater than about 1.5 mm and less than about 2.0 mm.

As described above, because the width W11 of each front electrode 141 and the width W12 of each back electrode 151 decrease, an incident area of light at the front surface and the back surface of the substrate 110 does not decrease even if the distances D11 and D12 increases.

An operation of the solar cell having the above-described structure is described below.

When light irradiated to the solar cell is incident on the substrate 110 through at least one of the first dielectric layer part 130 and the second dielectric layer part 190, electrons and holes are generated in the substrate 110 by light energy produced based on the incident light.

In this instance, because a reflection loss of the light incident on the substrate 110 is reduced by the first and second textured surfaces of the substrate 110, the first dielectric layer part 130, and the second dielectric layer part 190, an amount of light incident on the substrate 110 increases.

The electrons move to the n-type semiconductor part (for example, the substrate 110) and the holes move to the p-type semiconductor part (for example, the emitter region 121) by the p-n junction of the substrate 110 and the emitter region 121.

The holes moving to the emitter region 121 are collected by the front electrodes 141 and the front bus bars 142 and then move along the front bus bars 142. The electrons moving to the substrate 110 pass through the back surface field regions 172, are collected by the back electrodes 151 and the back bus bars 152, and move along the back bus bars 152.

When the front bus bars 142 of one solar cell are connected to the back bus bars 152 of another solar cell adjacent to the one solar cell using electric wires such as a conductive film, current flows therein to thereby enable use of the current for electric power.

As described above, each of the front surface and the back surface of the substrate 110, on which light is incident, has the double texturing structure, the incident area of the substrate 110 increases. Further, a reflection amount of light decreases due to a reflection operation using the first and second protrusions 11 and 111, and an amount of light incident on the substrate 110 increases.

The efficiency of the solar cell is improved by the anti-reflection effect using the refractive indexes of the first dielectric layer part 130 and the second dielectric layer part 190, the field passivation effect using the fixed charges, and the surface passivation effect using hydrogen (H) or oxygen (O).

A method for manufacturing the solar cell according to the embodiment of the invention is described below with reference to FIGS. 4A to 4H.

First, a substrate 110 is generally manufactured by slicing a silicon block or an ingot using a blade or a multi-wire saw. When the silicon block or the ingot is sliced, a mechanical damage layer is formed in the substrate 110.

Figure 4A:
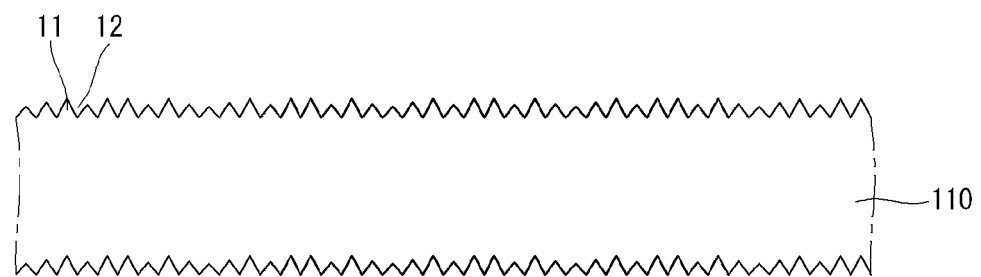
FIGS. 4A to 4H sequentially illustrate a method for manufacturing a solar cell according to an example embodiment of the invention.

Accordingly, a wet etching process is performed to remove the mechanical damage layer, so as to prevent a reduction in characteristics of the solar cell resulting from the mechanical damage layer of the substrate 110. In this instance, as shown in FIG. 4A, a first textured surface including a plurality of first protrusions 11 is formed on at least one surface of the substrate 110.

The first textured surface may be formed through the wet etching process. The wet etching process may use at least one of an acid chemical and a basic chemical.

An example of a process for forming the first textured surface is described below.

First, the wet etching process using the basic chemical is performed to etch at least one surface of the substrate 110. Examples of the basic chemical include potassium hydroxide (KOH), isopropyl alcohol (IPA), or other organic additives.

As described above, when the surface of the substrate 110 is etched using the basic chemical, the surface of the substrate 110 is textured to have the first textured surface including the plurality of first protrusions 11.

According to the method described above, after the plurality of first protrusions 11 are formed, a second textured surface including a plurality of second protrusions 111 is formed on the surface of each of the plurality of first protrusions 11 using a dry etching method such as a reaction ion etching (RIE) method.

Figure 4B:
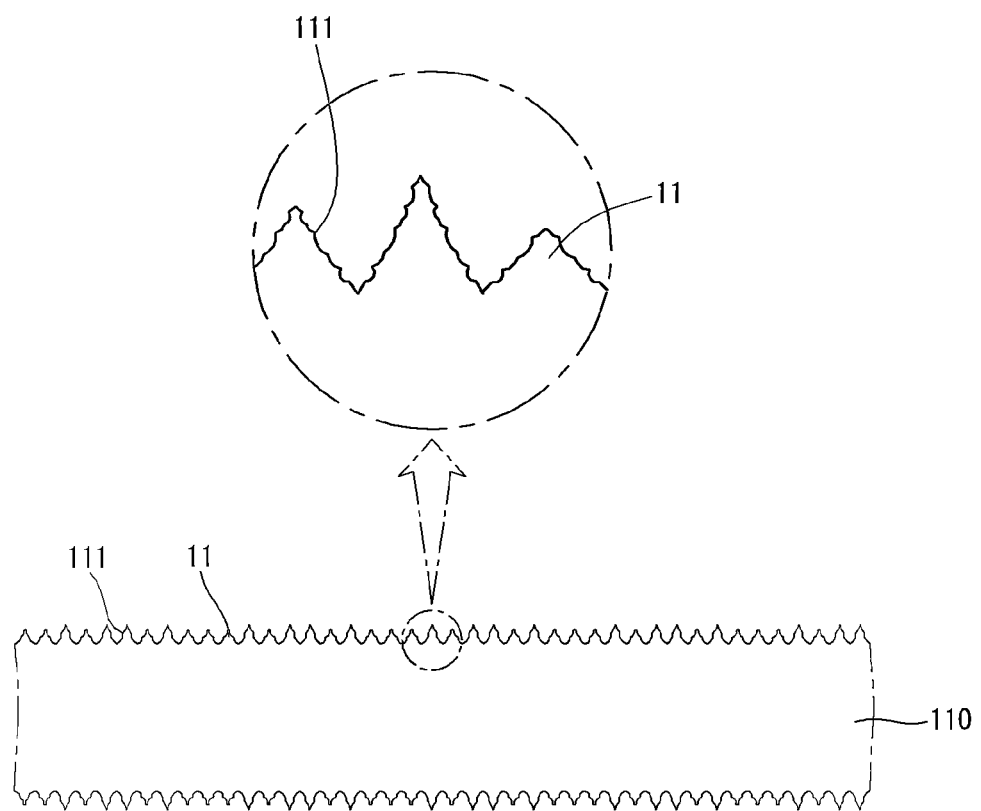

FIG. 4B shows the plurality of second protrusions 111 formed on the surface of each first protrusion 11.

Each of the plurality of second protrusions 111 has the size of about 300 nm to 600 nm. The plurality of second protrusions 111 are distributed on the surface of each first protrusion 11, so that in a vertical cross section of the second protrusions 111, a ratio a1/b1 of a length a1 of a virtual line connecting vertexes of the second protrusions 111 to a length b1 of a straight line connecting a start point and a finish point of the virtual line is about 1.1 to 1.3.

In the embodiment of the invention, an etching gas used in the reaction ion etching method may be a mixture of $SF_6$ and $Cl_2$.

After the second textured surface is formed, a process for removing a residue remaining in the surface of the substrate 110 is performed.

Figure 6A:
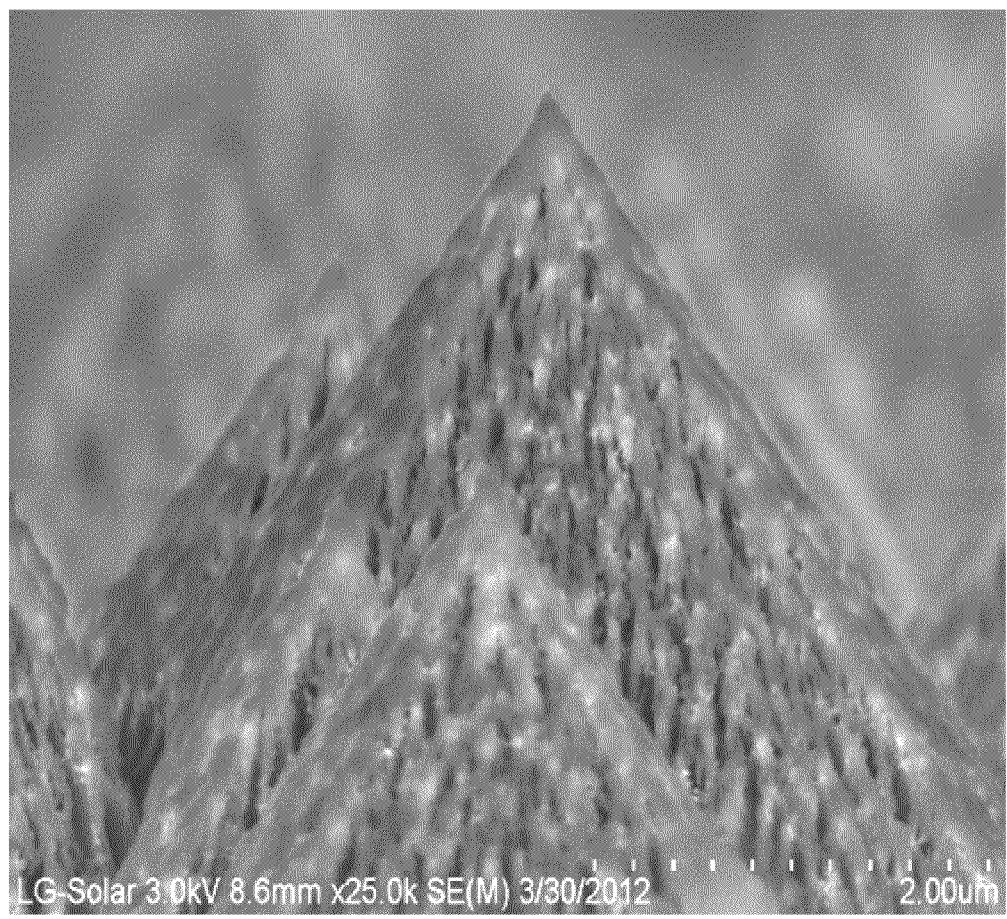
FIGS. 6A and 6B are photographs of minute protrusions taken by a microscope after the minute protrusions are formed using a reactive ion etching method.
Figure 6B:
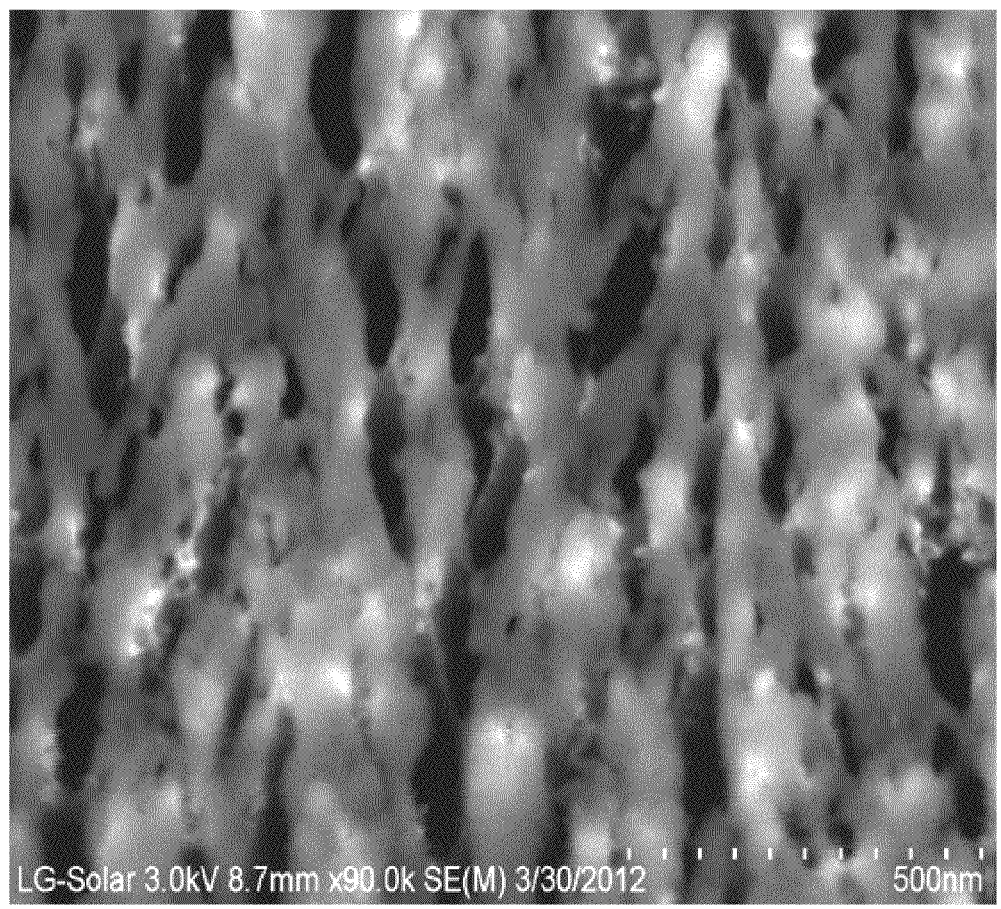

When the second protrusions 111 are formed using the reaction ion etching method, a large amount of impurities are adsorbed on the surface of the substrate 110 as shown in FIGS. 6A and 6B.

More specifically, FIG. 6A is a photograph of the first protrusion 11 having the second protrusions 111 magnified by a microscope at magnification capacity of 25,000 times. FIG. 6B is a photograph of the first protrusion 11 having the second protrusions 111 magnified by a microscope at magnification capacity of 90,000 times.

A damaged layer resulting from plasma was formed on the surface of each of the second protrusions 111 formed using the reaction ion etching method.

In a comparative example, a first cleansing process and a second cleansing process using an acid chemical were sequentially performed so as to remove the damaged layer.

An acid chemical obtained by mixing sulfuric acid ($H_2SO_4$) and hydrogen peroxide in a ratio of 1:1 to 4:1 was used in the first cleansing process. An acid chemical obtained by mixing ultrapure water, hydrogen chloride (HCl), and hydrogen peroxide in a ratio of 5:1:1 was used in the second cleansing process.

Figure 7A:
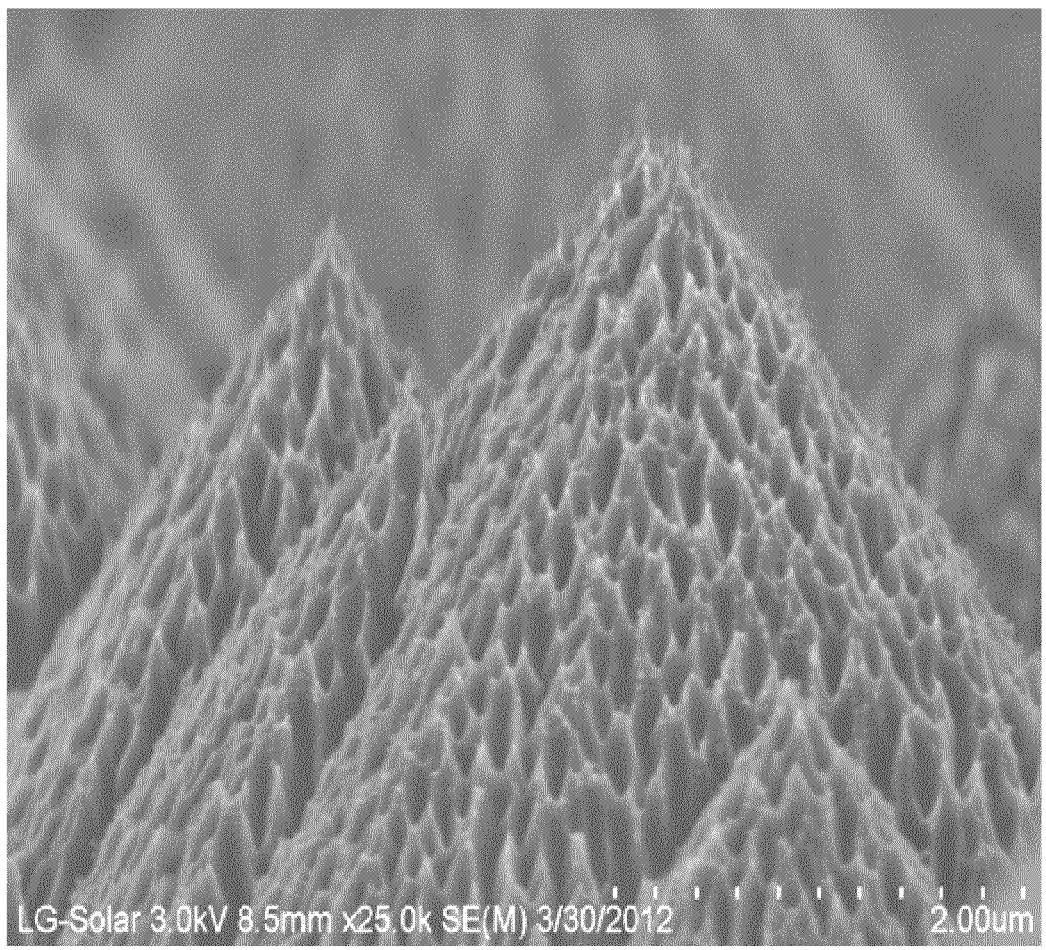
FIGS. 7A and 7B are photographs of minute protrusions taken by a microscope after a first cleansing process and a second cleansing process are performed using an acid chemical.
Figure 7B:
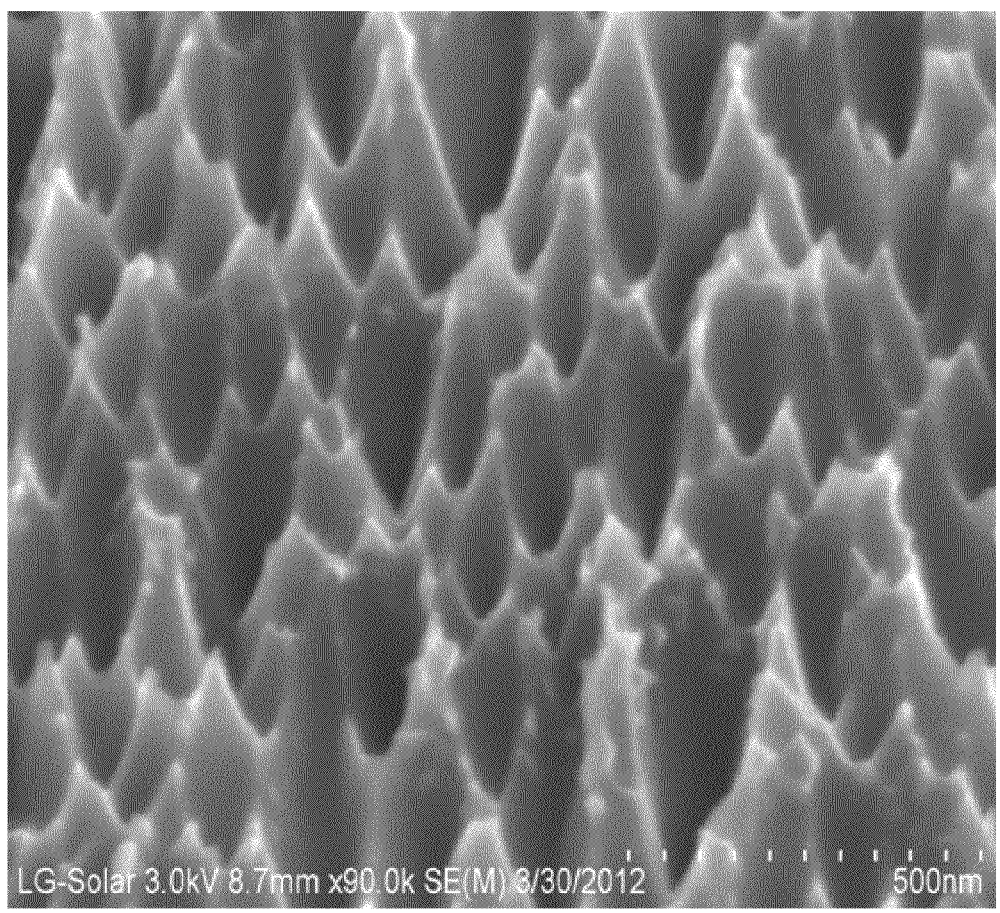

FIGS. 7A and 7B are photographs of minute protrusions taken by a microscope after a first cleansing process using an acid chemical obtained by mixing sulfuric acid ($H_2SO_4$) and hydrogen peroxide in a ratio of 1:1 to 4:1 and a second cleansing process using an acid chemical obtained by mixing ultrapure water, hydrogen chloride (HCl), and hydrogen peroxide in a ratio of 5:1:1 are performed. More specifically, FIG. 7A is a photograph of the first protrusion 11 having the second protrusions 111 magnified by the microscope at magnification capacity of 25,000 times. FIG. 7B is a photograph of the first protrusion 11 having the second protrusions 111 magnified by the microscope at magnification capacity of 90,000 times.

The impurities generated, when the first and second cleansing processes using the acid chemical were performed after forming the second protrusions 111 as shown in FIGS. 7A and 7B, were greatly removed as compared to FIGS. 6A and 6B.

However, even after the first and second cleansing processes using the acid chemical were performed, the damaged layers of the second protrusions 111 were not efficiently removed, and the impurities were not completely removed.

In the embodiment of the invention, a basic chemical instead of the acid chemical is used in the first cleansing process, so as to solve the above problem.

Figure 5:
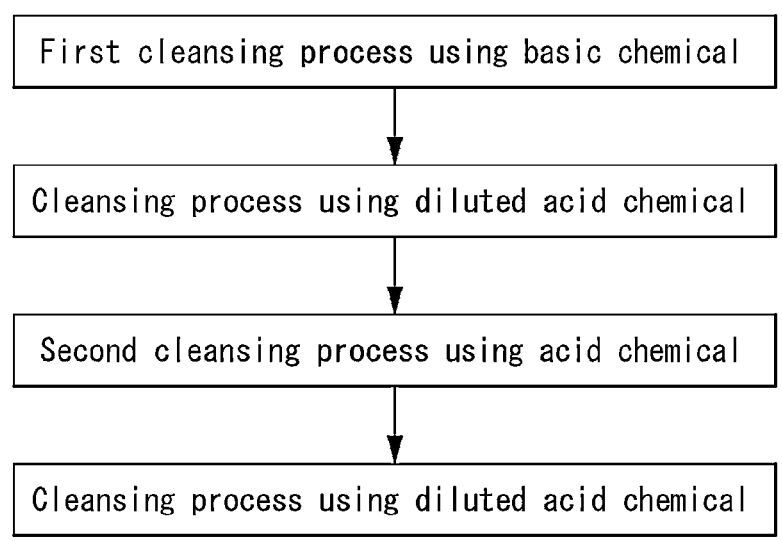
FIG. 5 is a block diagram illustrating a cleansing method according to an example embodiment of the invention.

This is described in detail below with reference to FIG. 5.

A cleansing method according to the embodiment of the invention may include a first cleansing process which removes surface damage portions of a plurality of minute protrusions using a basic chemical and removes impurities adsorbed on the surfaces of the minute protrusions, a process for cleansing the surfaces of the minute protrusions using a diluted acid chemical, a second cleansing process for removing impurities remaining or again adsorbed on the surfaces of the minute protrusions using an acid chemical after the first cleansing process, and a process for again cleansing the surfaces of the minute protrusions using a diluted acid chemical.

In the embodiment disclosed herein, the process for cleansing the surfaces of the minute protrusions using the diluted acid chemical, i.e., at least one of the cleansing process performed between the first cleansing process and the second cleansing process and the cleansing process performed after the second cleansing process may be omitted.

The first cleansing process may use a basic chemical obtained by mixing ultrapure water, ammonium hydroxide ($NH_4OH$), and hydrogen peroxide ($H_2O_2$) in a ratio of 5:1:1. The first cleansing process using the basic chemical may be performed at a temperature equal to or lower than about 70° C. for about 5 to 10 minutes.

Potassium hydroxide (KOH) having an etching performance better than ammonium hydroxide ($NH_4OH$) may be used in the first cleansing process instead of ammonium hydroxide ($NH_4OH$). Basic materials, having hydroxyl radical (OH), other than ammonium hydroxide ($NH_4OH$) and potassium hydroxide (KOH) may be used in the first cleansing process.

When the first cleansing process using the basic chemical is performed, the surface of the second protrusion is removed through the etching of a thin thickness, and impurities adsorbed on the surface of the second protrusion are removed.

The second cleansing process may use an acid chemical obtained by mixing ultrapure water, hydrogen chloride (HCl), and hydrogen peroxide ($H_2O_2$) in a ratio of 5:1:1. The second cleansing process using the acid chemical may be performed at a temperature equal to or lower than about 70° C. for about 5 to 10 minutes.

The second cleansing process using the acid chemical efficiently removes impurities again adsorbed on the surfaces of the second protrusions after the first cleansing process.

The diluted acid chemical may be obtained by mixing ultrapure water and hydrogen fluoride (HF) in a ratio of 10:1 to 7:1. The cleansing process using the diluted acid chemical may be performed at the normal temperature for about 5 to 10 minutes.

Figure 8A:
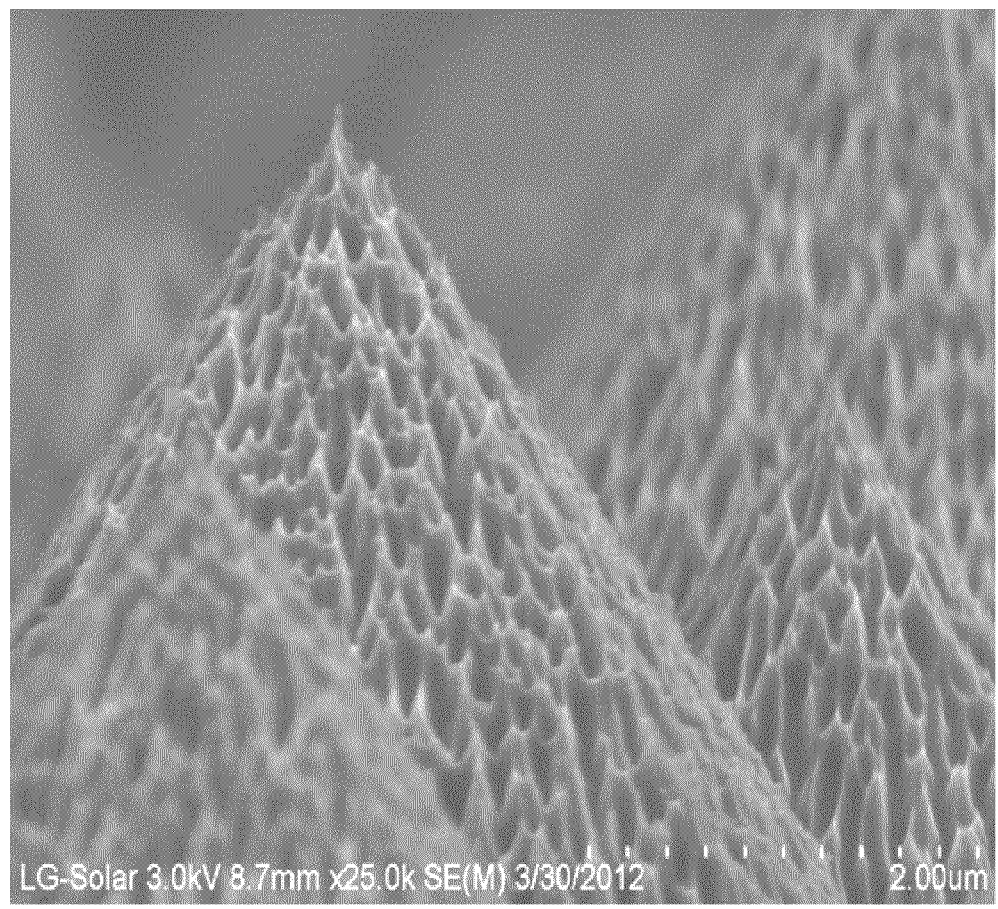
FIGS. 8A and 8B are photographs of minute protrusions taken by a microscope after a first cleansing process using a basic chemical and a second cleansing process using an acid chemical are performed.
Figure 8B:
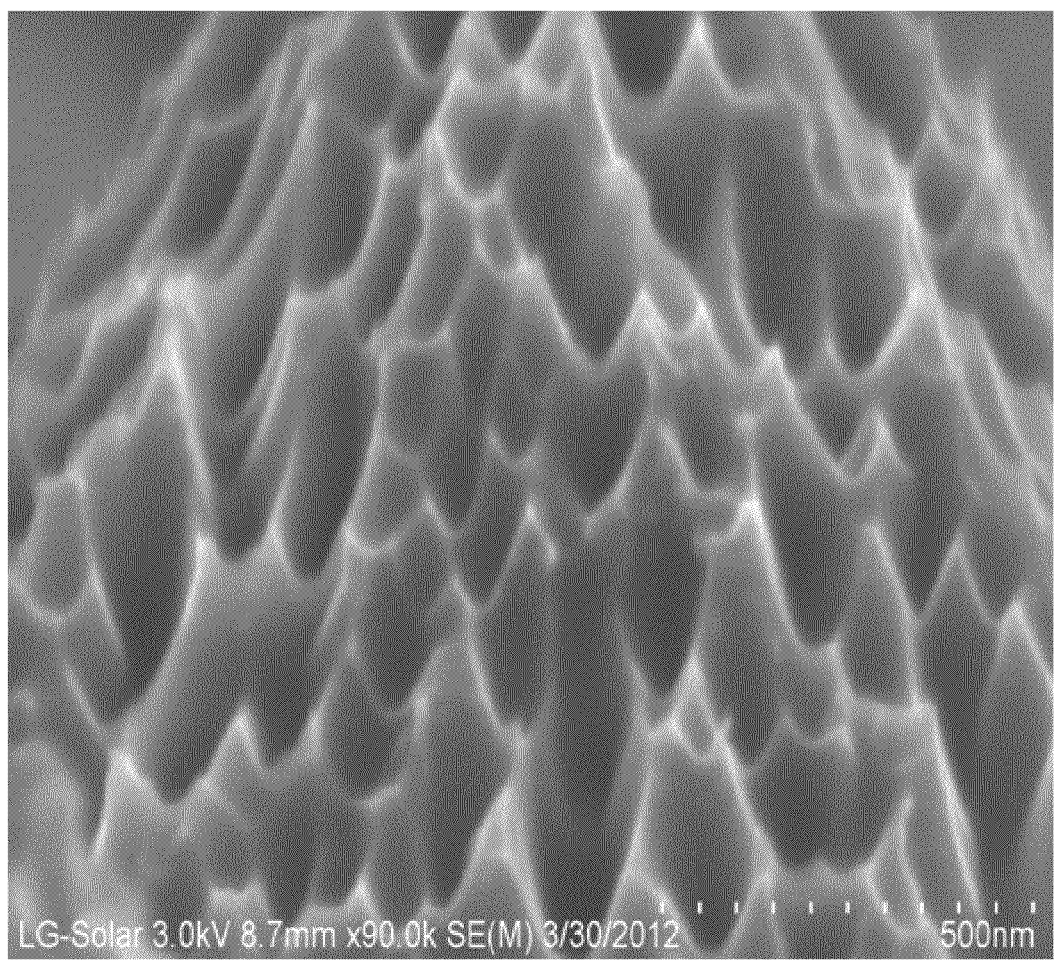

FIGS. 8A and 8B are photographs of minute protrusions taken by a microscope after a first cleansing process using a basic chemical and a second cleansing process using an acid chemical are performed. More specifically, FIG. 8A is a photograph of the first protrusion 11 having the second protrusions 111 magnified by the microscope at magnification capacity of 25,000 times. FIG. 8B is a photograph of the first protrusion 11 having the second protrusions 111 magnified by the microscope at magnification capacity of 90,000 times.

The impurities generated, when the first cleansing process using the basic chemical and the second cleansing process using the acid chemical were performed after forming the second protrusions 111 as shown in FIGS. 8A and 8B, were more efficiently removed as compared to FIGS. 7A and 7B.

The following Table 1 indicates characteristics of the solar cell measured after performing the cleansing process according to each of the embodiment of the invention and the comparative example. In the following Table 1, the cleansing process according to the comparative example used the acid chemical in both the first and second cleansing processes. A first example of the cleansing process according to the embodiment of the invention used ammonium hydroxide ($NH_4OH$) in the first cleansing process using the basic chemical, and a second example of the cleansing process according to the embodiment of the invention used potassium hydroxide (KOH) in the first cleansing process using the basic chemical.

TABLE 1

| | Open-circuit voltage | Short circuit current density | Fill factor | Efficiency |
|---|---|---|---|---|
| Comparative example | 649 | 38.6 | 79.5 | 19.9 |
| First example embodiment | 650 | 38.6 | 80.0 | 20.1 |
| Second example embodiment | 650 | 38.6 | 80.0 | 20.1 |

As indicated by the above Table 1, the characteristics of the solar cell in the first and second examples according to the embodiment of the invention were greatly improved, as compared to the comparative example using the acid chemical in both the first and second cleansing processes.

So far, the cleansing method according to the embodiment of the invention including the first cleansing process using the basic chemical (for example, a moisture of ultrapure water, potassium hydroxide, and hydrogen peroxide), the cleansing process using the diluted acid chemical (for example, a moisture of ultrapure water and hydrogen fluoride), the second cleansing process using the acid chemical (for example, a moisture of ultrapure water, hydrogen chloride, and hydrogen peroxide), and the cleansing process using the diluted acid chemical (for example, a moisture of ultrapure water and hydrogen fluoride) was described.

Alternatively, the basic chemical used in the first cleansing process may not contain hydrogen peroxide. In other words, the basic chemical used in the first cleansing process may be formed by mixing a basic material having hydroxyl radical (OH), for example, potassium hydroxide or ammonium hydroxide and ultrapure water.

In another example of the cleansing method, the second cleansing process using the acid chemical and the cleansing process using the diluted acid chemical may be integrated into one process and may be performed as one process. Namely, the two cleansing processes may be reduced to one process.

When the second cleansing process using the acid chemical and the cleansing process using the diluted acid chemical are integrated into one process and are performed as one process, the acid chemical may be formed by mixing ultrapure water, hydrogen chloride, and hydrogen fluoride.

Accordingly, in this instance, the cleansing method according to the embodiment of the invention may include the first cleansing process using the basic chemical (for example, the moisture of ultrapure water, potassium hydroxide, and hydrogen peroxide), the cleansing process using the diluted acid chemical (for example, the moisture of ultrapure water and hydrogen fluoride), and the second cleansing process using the acid chemical (for example, the moisture of ultrapure water, hydrogen chloride, and hydrogen fluoride).

In another example of the cleansing method, the cleansing process using the diluted acid chemical, the second cleansing process using the acid chemical, and the cleansing process using the diluted acid chemical may be integrated into one process and may be performed as one process. Namely, the three cleansing processes may be reduced to one process.

When the cleansing process using the diluted acid chemical, the second cleansing process using the acid chemical, and the cleansing process using the diluted acid chemical are integrated into one process and are performed as one process, the acid chemical may be formed by mixing ultrapure water, hydrogen chloride, and hydrogen fluoride.

Accordingly, in this instance, the cleansing method according to the embodiment of the invention may include the first cleansing process using the basic chemical (for example, the moisture of ultrapure water, potassium hydroxide, and hydrogen peroxide) and the second cleansing process using the acid chemical (for example, the moisture of ultrapure water, hydrogen chloride, and hydrogen fluoride). After the surface of the semiconductor substrate 110 is cleansed through the various cleansing methods described above, an emitter region 121 is formed at a front surface of the substrate 110 as shown in FIG. 4C.

Figure 4C:
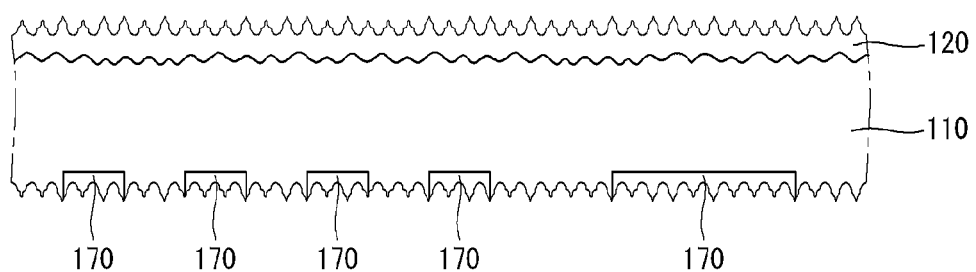

More specifically, as shown in FIG. 4C, the emitter region 121 may be formed by implanting first impurities of a corresponding conductive type (i.e., a second conductive type) into the front surface of the substrate 110 using an ion implantation method and then performing an activation process.

In this instance, the conductive type of the emitter region 121 may be the second conductive type (for example, p-type) opposite a first conductive type of the substrate 110. In the embodiment of the invention, the first impurities may use boron (B).

Accordingly, the first impurities of the second conductive type are implanted into the exposed front surface of the substrate 110 to form an impurity region, i.e., a first impurity region 120 of the second conductive type at the front surface of the substrate 110.

Subsequently, second impurities of a corresponding conductive type (i.e., the first conductive type) (for example, n-type) are implanted into a back surface of the substrate 110 using the ion implantation method to form a second impurity region 170 of the first conductive type at the back surface of the substrate 110. In the embodiment of the invention, the second impurities may use phosphorus (P).

A mask to implant the impurities only into a desired region of each of the front surface and the back surface of the substrate 110 may be used in the ion implantation process for forming the first and second impurity regions 120 and 170.

For example, the mask positioned on the front surface of the substrate 110 may block only an edge of the front surface of the substrate 110 and may expose a remaining portion of the front surface of the substrate 110 except the edge. Further, the mask positioned on the back surface of the substrate 110 may expose an edge of the back surface of the substrate 110 and a formation area of back electrodes and back bus bars and may block a remaining portion of the back surface of the substrate 110.

Ion implantation energy for implanting first impurity ions and second impurity ions into the substrate 110 may be about 1 keV to 20 keV. An ion implantation depth may be determined depending on the ion implantation energy.

Thus, ion implantation energy for the first impurity region 120 may be different from ion implantation energy for the second impurity region 170.

For example, ion implantation energy used to implant ions of p-type impurities into the substrate 110 may be greater than ion implantation energy used to implant ions of n-type impurities into the substrate 110.

In the embodiment of the invention, formation order of the first impurity region 120 and the second impurity region 170 may vary. The first impurity region 120 and the second impurity region 170 may be formed in the same chamber or respective chambers.

Figure 4D:
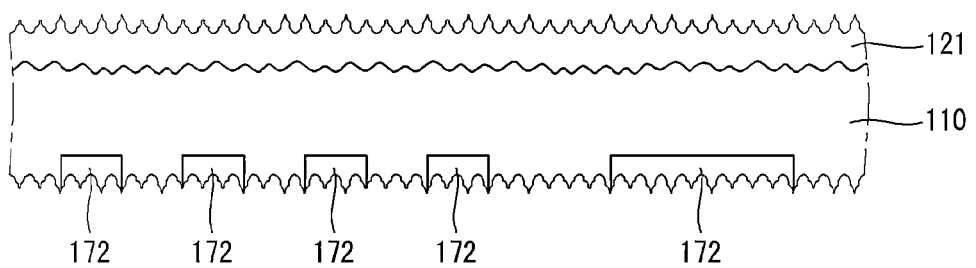

Next, as shown in FIG. 4D, after the first impurity region 120 and the second impurity region 170 are formed, a thermal process is performed on the substrate 110 in an atmosphere of nitrogen ($N_2$) or oxygen ($O_2$).

Hence, the first and second impurity regions 120 and 170 are completely activated. As a result, the first impurity region 120 forms an emitter region 121 positioned at the front surface of the substrate 110, and thus the emitter region 121 and the substrate 110 form a p-n junction. Further, the second impurity region 170 forms a plurality of back surface field regions 172 positioned at the back surface of the substrate 110.

In other words, the p-type impurities and the n-type impurities implanted into the substrate 110 respectively form the first impurity region 120 and the second impurity region 170 in an interstitial state. However, when the first and second impurity regions 120 and 170 are activated through the thermal process, a state of impurities is changed from the interstitial state to a substitutional state. Hence, silicon and ions of p-type and n-type impurities are rearranged. As a result, the first impurity region 120 and the second impurity region 170 respectively serve as the p-type emitter region 121 and the n-type back surface field region 172.

Solubility of boron (B) used to form the emitter region 121 is less than solubility of phosphorus (P) used to form the back surface field regions 172. Therefore, it is preferable, but not required, that an activation temperature of the first and second impurity regions 120 and 170 is determined based on the first impurity region 120, so as to stably activate the first impurity region 120.

Thus, in the embodiment of the invention, the activation temperature of the first and second impurity regions 120 and 170 may be a temperature capable of stably activating the first impurity region 120, for example, about 1,000° C. to 2,000° C. Further, time required in the thermal process may be about 20 minutes to 60 minutes.

In the embodiment of the invention, because the activation process is performed at a high temperature equal to or higher than about 1,000° C. capable of stably activating boron (B) (i.e., the first impurity region 120), the first impurity region 120 as well as the second impurity region 170 are stably activated. Hence, the emitter region 121 and the back surface field regions 172 are smoothly formed.

Furthermore, because the thermal process is performed at the high temperature equal to or higher than about 1,000° C., a damaged portion generated in the ion implantation process for the first and second impurity regions 120 and 170 is recrystallized. Hence, the damaged portion generated in the ion implantation process is recovered without a separate removal process using the wet etching method, etc.

So far, the embodiment of the invention described that the emitter region 121 and the back surface field regions 172 are formed through the ion implantation method, as an example. However, the emitter region 121 and the back surface field regions 172 may be formed through a typical thermal diffusion method.

Figure 4E:
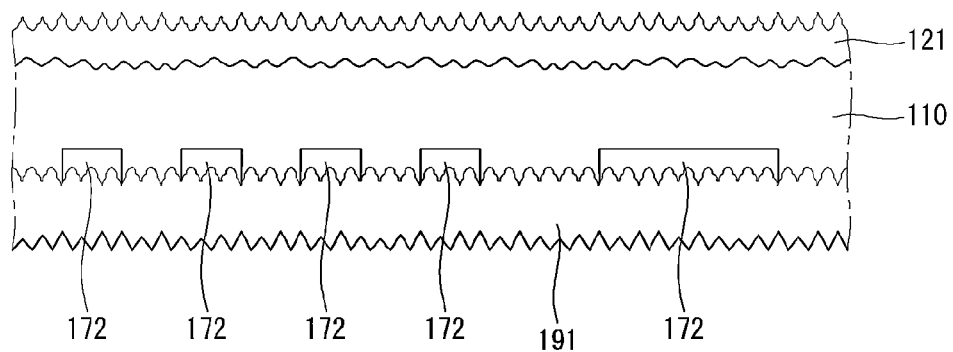

Next, as shown in FIG. 4E, a first dielectric layer 191 formed of hydrogenated silicon nitride (SiNx:H) is formed on the back surface of the substrate 110.

The first dielectric layer 191 may be formed using a deposition method such as a plasma enhanced chemical vapor deposition (PECVD) method. In the embodiment of the invention, the first dielectric layer 191 may have a thickness of about 70 nm to 100 nm.

Figure 4F:
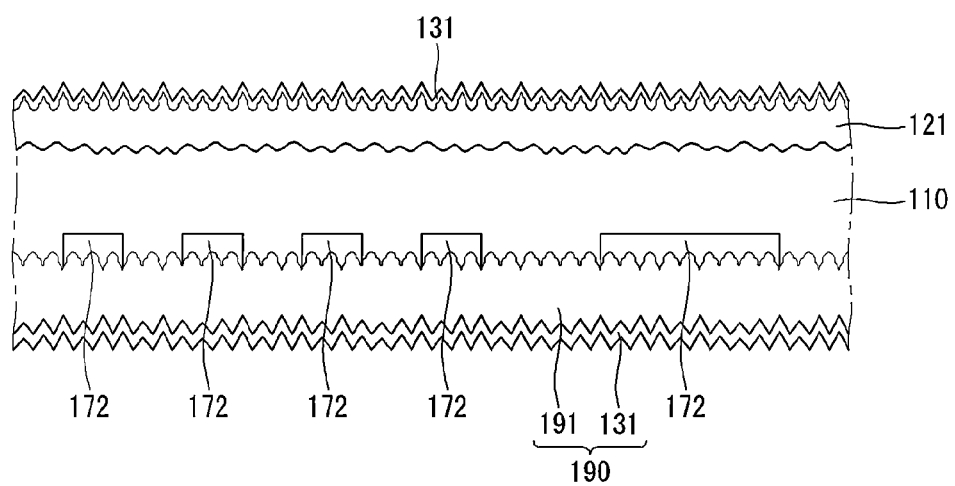

Next, as shown in FIG. 4F, second dielectric layers 131 formed of aluminum oxide ($Al_2O_3$) are respectively formed on the emitter region 121 positioned at the front surface of the substrate 110 and the first dielectric layer 191 positioned on the back surface of the substrate 110.

The second dielectric layer 131 may be formed using the PECVD method, an atomic layer deposition (ALD) method, etc.

When the second dielectric layer 131 is formed using the PECVD method, the layer is stacked only in a portion exposed by a process gas. Therefore, the second dielectric layer 131 formed of aluminum oxide may be formed on each of the front surface and the back surface of the substrate 110 through the separate PECVD method.

In this instance, the second dielectric layers 131 respectively positioned on the front surface and the back surface of the substrate 110 may be formed under the same process conditions and thus may have the same characteristics. Alternatively, the second dielectric layers 131 may be formed under different process conditions and thus may have different characteristics.

On the other hand, when the second dielectric layers 131 are formed using the ALD method, the second dielectric layers 131 may be formed on the back surface and the lateral surface as well as the front surface of the substrate 110 through one stacking process.

Thus, the ALD process may be performed once to simultaneously form the second dielectric layers 131 on the front surface and the back surface of the substrate 110. In this instance, because the second dielectric layers 131 respectively positioned on the front surface and the back surface of the substrate 110 are formed under the same process conditions, the second dielectric layers 131 have the same characteristics.

In the embodiment of the invention, the second dielectric layer 131 may have a thickness of about 5 nm to 15 nm.

When the second dielectric layer 131 is formed, a second dielectric layer part 190 including the first dielectric layer 191 and the second dielectric layer 131 is formed on the back surface of the substrate 110.

Figure 4G:
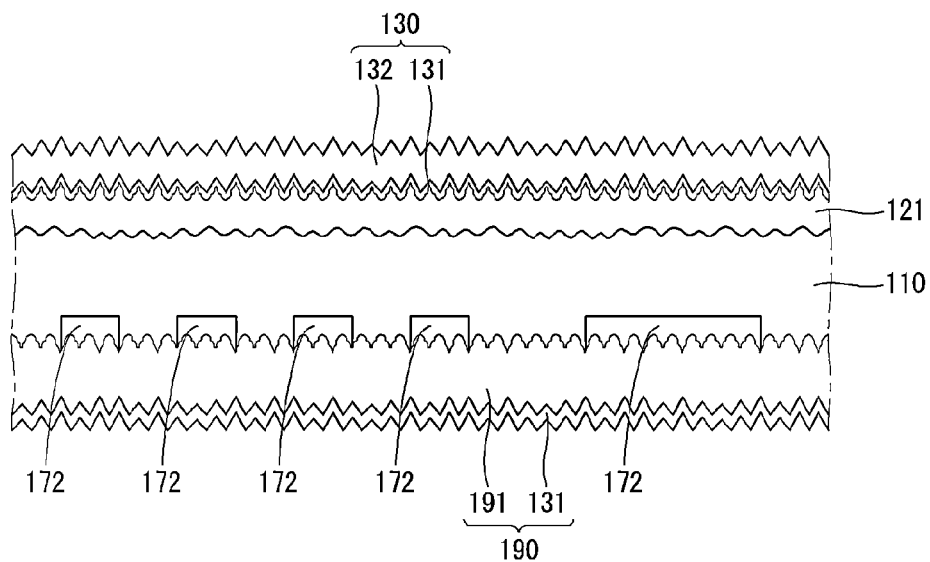

Next, as shown in FIG. 4G, a third dielectric layer 132 formed of hydrogenated silicon nitride (SiNx:H) is formed on the second dielectric layer 131 on the front surface of the substrate 110 using the PECVD method at a thickness of about 70 nm to 100 nm.

Hence, a first dielectric layer part 130 including the second dielectric layer 131 and the third dielectric layer 132 is formed on the front surface of the substrate 110.

As described above, the first dielectric layer part 130 is formed on the front surface of the substrate 110, and the second dielectric layer part 190 is formed on the back surface of the substrate 110. Afterward, a front electrode part 140 including a plurality of front electrodes 141 and a plurality of front bus bars 142, which pass through the first dielectric layer part 130 and contact the emitter region 121 underlying the first dielectric layer part 130, is formed. Further, a back electrode part 150 including a plurality of back electrodes 151 and a plurality of back bus bars 152, which pass through the second dielectric layer part 190 and contact the back surface field regions 172 underlying the second dielectric layer part 190, is formed.

An example of a method for forming the front electrode part 140 and the back electrode part 150 is described below with reference to FIG. 4H.

Figure 4H:
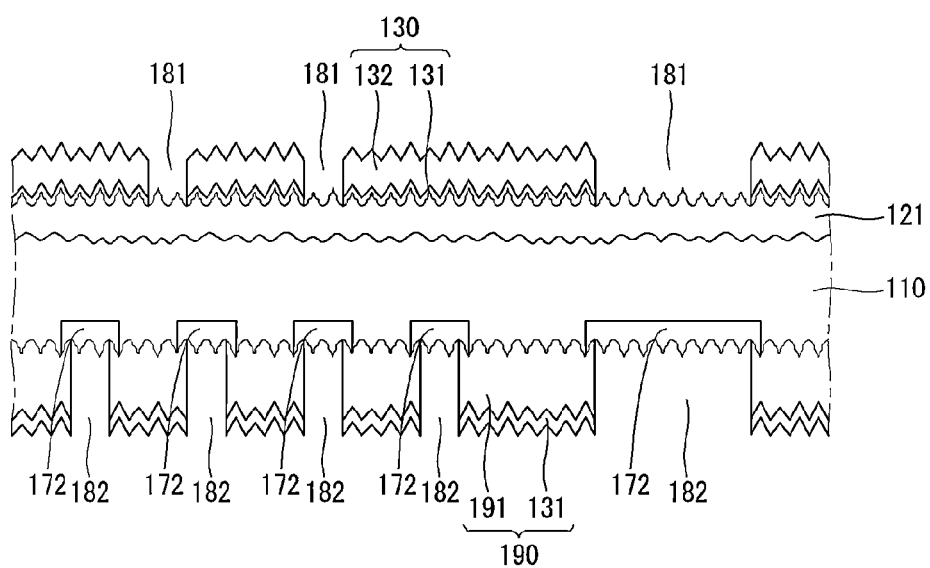

For example, as shown in FIG. 4H, a laser beam is selectively irradiated onto each of the front surface and the back surface of the substrate 110 to form a plurality of first openings 181 and a plurality of second openings 182 at positions to form the front electrode part 140 and the back electrode part 150.

The plurality of first openings 181 pass through the first dielectric layer part 130 and expose the emitter region 121 underlying the first dielectric layer part 130. The plurality of second openings 182 pass through the second dielectric layer part 190 and expose the back surface field regions 172 underlying the second dielectric layer part 190.

The plurality of first openings 181 are used to form the plurality of front electrodes 141 and the plurality of front bus bars 142. In this instance, a width of the first opening 181 for each front electrode 141 is less than a width of the first opening 181 for each front bus bar 142.

The plurality of second openings 182 are used to form the plurality of back electrodes 151 and the plurality of back bus bars 152. In this instance, a width of the second opening 182 for each back electrode 151 is less than a width of the second opening 182 for each back bus bar 152.

The number of first openings 181 for the front electrodes 141 may be less than the number of second openings 182 for the back electrodes 151. Hence, a distance between the two adjacent first openings 181 may be greater than a distance between the two adjacent second openings 182.

The first openings 181 for the front bus bars 142 may be positioned opposite the second openings 182 for the back bus bars 152 with the substrate 110 between them.

Subsequently, the front electrode part 140 including the front electrodes 141 and the front bus bars 142 is formed on the emitter region 121 exposed by the first openings 181 using a plating method such as an electroplating method and an electroless plating method. In the same manner as the front electrode part 140, the back electrode part 150 including the back electrodes 151 and the back bus bars 152 is formed on the back surface field regions 172 exposed by the second openings 182 using the plating method.

In another embodiment, the front electrodes 141, the front bus bars 142, the back electrodes 151, and the back bus bars 152 may be formed by coating a metal paste containing a metal material, for example, silver (Ag) on the first and second openings 181 and 182 using a screen printing method, etc. and then performing a thermal process on the metal paste at a desired temperature.

In another embodiment, the front electrodes 141, the front bus bars 142, the back electrodes 151, and the back bus bars 152 may be formed by coating and drying a metal paste containing silver (Ag) or a metal paste containing silver (Ag) and aluminum (Al) on each of the first dielectric layer part 130 and the second dielectric layer part 190 and then performing a thermal process on the metal paste.

In this instance, the front electrode part 140 have to pass through the first dielectric layer part 130, and the back electrode part 150 have to pass through the second dielectric layer part 190.

Accordingly, the metal paste may contain a material, for example, PbO for etching the first dielectric layer part 130 and the second dielectric layer part 190. An amount and a kind of the etching material contained in the metal paste may be determined depending on a thickness or a material of the first dielectric layer part 130 and the second dielectric layer part 190.

Accordingly, when the thermal process is performed on the metal paste which is coated and dried on the first dielectric layer part 130 and the second dielectric layer part 190, the metal paste passes through the first dielectric layer part 130 and the second dielectric layer part 190 and is chemically bonded to the emitter region 121 and the back surface field regions 172. Hence, the front electrode part 140 electrically and physically connected to the emitter region 121 and the back electrode part 150 electrically and physically connected to the back surface field regions 172 are formed.

Alternatively, when at least one of the first dielectric layer part 130 and the second dielectric layer part 190 is omitted, a metal paste forming an electrode part, which does not need to pass through the first dielectric layer part 130 and the second dielectric layer part 190, may not contain an etching material or may contain the etching material to the extent that it does not affect the pass of the first dielectric layer part 130 and the second dielectric layer part 190.

The first dielectric layer part 130 may additionally include a hydrogenated silicon oxide layer, which is positioned directly on the third dielectric layer 132 and is formed of hydrogenated silicon oxide (SiOx:H). Further, the second dielectric layer part 190 on the back surface of the substrate 110 may additionally include a hydrogenated silicon oxide layer, which is positioned between the first dielectric layer 191 formed of hydrogenated silicon nitride (SiNx:H) and the second dielectric layer 131 formed of aluminum oxide ($Al_2O_3$) and is formed of hydrogenated silicon oxide (SiOx:H).

The hydrogenated silicon oxide layer prevents hydrogen (H), which exists in the third dielectric layer 132 and the first dielectric layer 191 underlying the hydrogenated silicon oxide layer to perform the surface passivation function, from moving to the opposite side of the substrate 110. Hence, the passivation effect and the anti-reflection effect at the surface of the substrate 110 are further improved.

A silicon oxide layer formed of silicon oxide (SiOx) may be additionally formed between the emitter region 121 and the first dielectric layer part 130 and between the back surface of the substrate 110 and the first dielectric layer 191.

The silicon oxide layer may suppress a blistering phenomenon generated when an aluminum oxide ($Al_2O_3$) layer, etc., is formed on a natural oxide layer, and may further improve the passivation effect.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell, the method comprising:
    performing a dry etching process to form a textured surface including a plurality of minute protrusions on a first surface of a semiconductor substrate;
    performing a first cleansing process for removing damaged portions of surfaces of the minute protrusions using a first chemical and removing impurities adsorbed on the surfaces of the minute protrusions, the first chemical consisting of a basic chemical;
    performing a second cleansing process for removing impurities remaining or again adsorbed on the surfaces of the minute protrusions using a second chemical after performing the first cleansing process, the second chemical consisting of an acid chemical; and
    forming an emitter region at the first surface of the semiconductor substrate.

2. The method of claim 1, wherein the dry etching process includes a reaction ion etching method.

3. The method of claim 1, wherein the basic chemical is formed by mixing ultrapure water and a basic material having a hydroxyl radical (OH).

4. The method of claim 3, wherein the basic chemical additionally contains hydrogen peroxide.

5. The method of claim 3, wherein the basic material having the hydroxyl radical includes a potassium hydroxide solution or an ammonium hydroxide solution.

6. The method of claim 1, wherein the acid chemical is formed by mixing ultrapure water, hydrogen chloride, and hydrogen peroxide.

7. The method of claim 6, further comprising again cleansing the surfaces of the minute protrusions using a diluted acid chemical between the first cleansing process and the second cleansing process.

8. The method of claim 7, wherein the diluted acid chemical is formed by mixing ultrapure water and hydrogen fluoride.

9. The method of claim 6, further comprising, after the second cleansing process, again cleansing the surfaces of the minute protrusions using a diluted acid chemical.

10. The method of claim 9, wherein the diluted acid chemical is formed by mixing ultrapure water and hydrogen fluoride.

11. The method of claim 1, wherein the acid chemical is formed by mixing ultrapure water, hydrogen chloride, and hydrogen fluoride.

12. The method of claim 1, wherein the forming of the emitter region includes injecting impurities of a first conductive type into the first surface of the semiconductor substrate using an ion implantation method or a thermal diffusion method.

13. The method of claim 12, further comprising:
    forming a second textured surface including a plurality of minute protrusions on a second surface opposite the first surface of the semiconductor substrate; and
    locally forming a back surface field region at the second surface of the semiconductor substrate.

14. The method of claim 13, wherein the forming of the back surface field region includes injecting impurities of a second conductive type opposite the first conductive type into the second surface of the semiconductor substrate using the ion implantation method or the thermal diffusion method.

15. The method of claim 14, further comprising:
    forming a first dielectric layer on the second surface of the semiconductor substrate;

simultaneously forming a second dielectric layer on the emitter region and on the first dielectric layer positioned on the second surface of the semiconductor substrate;

forming a third dielectric layer on the second dielectric layer positioned on the emitter region; and forming a first electrode part connected to the emitter region and a second electrode part connected to the back surface field region.

16. The method of claim 15, wherein the first dielectric layer and the third dielectric layer are formed by depositing hydrogenated silicon nitride at a thickness of about 70 nm to 100 nm, wherein the second dielectric layer is formed by depositing aluminum oxide at a thickness of about 5 nm to 15 nm, aluminum oxide being deposited using an atomic layer deposition method.

17. The method of claim 15, wherein the back surface field region is formed in the same pattern as a plurality of finger electrodes of the second electrode part.

* * * * *